(12) United States Patent  
Furihata et al.

(10) Patent No.: US 8,159,440 B2  
(45) Date of Patent: Apr. 17, 2012

(54) CONTROLLER DRIVER AND DISPLAY APPARATUS USING THE SAME

(75) Inventors: Hirobumi Furihata, Kanagawa (JP); Katsuhisa Oohashi, Kanagawa (JP); Junyou Shioda, Kanagawa (JP); Yoshiyuki Teshirogi, Kanagawa (JP); Takashi Nose, Kanagawa (JP); Mika Tuomi, Noormarkku (FI)

(73) Assignees: Advanced Micro Devices, Inc., Sunnyvale, CA (US); Renesas Electronics Corporation, Kanagawa (JP)

( * ) Notice: Subject to any disclaimer, the term of this patent is extended or adjusted under 35 U.S.C. 154(b) by 803 days.

(21) Appl. No.: 10/561,270

(22) PCT Filed: Jun. 28, 2004

(86) PCT No.: PCT/JP2004/009462  
§ 371 (c)(1),  
(2), (4) Date: Jan. 23, 2006

(87) PCT Pub. No.: WO2005/001807  
PCT Pub. Date: Jan. 6, 2005

(65) Prior Publication Data  
US 2006/0244707 A1 Nov. 2, 2006

(30) Foreign Application Priority Data  
Jun. 30, 2003 (JP) .................. 2003-186936

(51) Int. Cl.  
G09G 3/36 (2006.01)

(52) U.S. Cl. ............. 345/98; 345/536; 365/189.04

(58) Field of Classification Search ......... 345/536–539, 345/555; 365/189.04, 189.17, 189.2, 189.05  
See application file for complete search history.

(56) References Cited

U.S. PATENT DOCUMENTS

| | | | |
|---|---|---|---|
| 5,034,733 A | 7/1991 | Okazawa et al. | |
| 5,170,157 A | 12/1992 | Ishii | |
| 5,636,336 A * | 6/1997 | Adachi | 345/667 |
| 5,644,758 A * | 7/1997 | Patrick et al. | 345/562 |
| 5,726,947 A * | 3/1998 | Yamazaki et al. | 365/230.03 |
| 5,751,930 A * | 5/1998 | Katsura et al. | 345/615 |
| 5,907,314 A | 5/1999 | Negishi et al. | |
| 6,323,866 B1 * | 11/2001 | Chen et al. | 345/519 |
| 7,088,322 B2 | 8/2006 | Koyama et al. | |
| 7,103,226 B1 * | 9/2006 | Frank et al. | 382/254 |
| 7,176,864 B2 | 2/2007 | Moriyama et al. | |
| 7,206,003 B2 * | 4/2007 | Nose et al. | 345/690 |
| 7,737,931 B2 | 6/2010 | Koyama et al. | |
| 2001/0015727 A1 | 8/2001 | Gunji et al. | |
| 2002/0075272 A1 | 6/2002 | Tani et al. | |
| 2002/0126108 A1 | 9/2002 | Kato et al. | |
| 2003/0184552 A1 * | 10/2003 | Chadha | 345/581 |

(Continued)

FOREIGN PATENT DOCUMENTS  
EP 0 488 851 A1 11/1991  
(Continued)

Primary Examiner — Amare Mengistu  
Assistant Examiner — Vinh Lam  
(74) Attorney, Agent, or Firm — Foley & Lardner LLP

(57) ABSTRACT

A controller/driver is composed of a work memory, a graphic engine, a display memory, and a driver circuit. The graphic engine converts externally received image data into first bitmap data, and stores the first bitmap data in the work memory. The display memory receives and stores second bitmap data developed from the first bitmap data stored in the work memory. The driver circuit drives a display panel in response to the second bitmap data received from the display memory.

19 Claims, 25 Drawing Sheets

U.S. PATENT DOCUMENTS

| | | |
|---|---|---|
| 2004/0056872 A1 | 3/2004 | Pai et al. |
| 2007/0024606 A1 | 2/2007 | Moriyama et al. |

FOREIGN PATENT DOCUMENTS

| | | |
|---|---|---|
| EP | 0 681 280 B1 | 11/1995 |
| EP | 0 681 282 B1 | 11/1995 |
| EP | 0 802 519 A1 | 10/1997 |
| EP | 0 881 598 A2 | 12/1998 |
| EP | 1 182 639 A2 | 5/2001 |
| EP | 1 143 331 A2 | 10/2001 |
| EP | 1 146 501 A1 | 10/2001 |
| EP | 1 164 570 B1 | 12/2001 |
| EP | 1 411 492 A1 | 4/2004 |
| JP | 58-014242 | 1/1983 |
| JP | 64-13585 A | 1/1989 |
| JP | 7-028990 | 1/1995 |
| JP | 2002-91332 A | 3/2002 |
| JP | 2002-182627 A | 6/2002 |
| JP | 2003-108091 A | 4/2003 |
| KR | 10-2001-0037956 | 5/2001 |
| WO | WO 95/12164 | 5/1995 |

* cited by examiner

Fig. 16
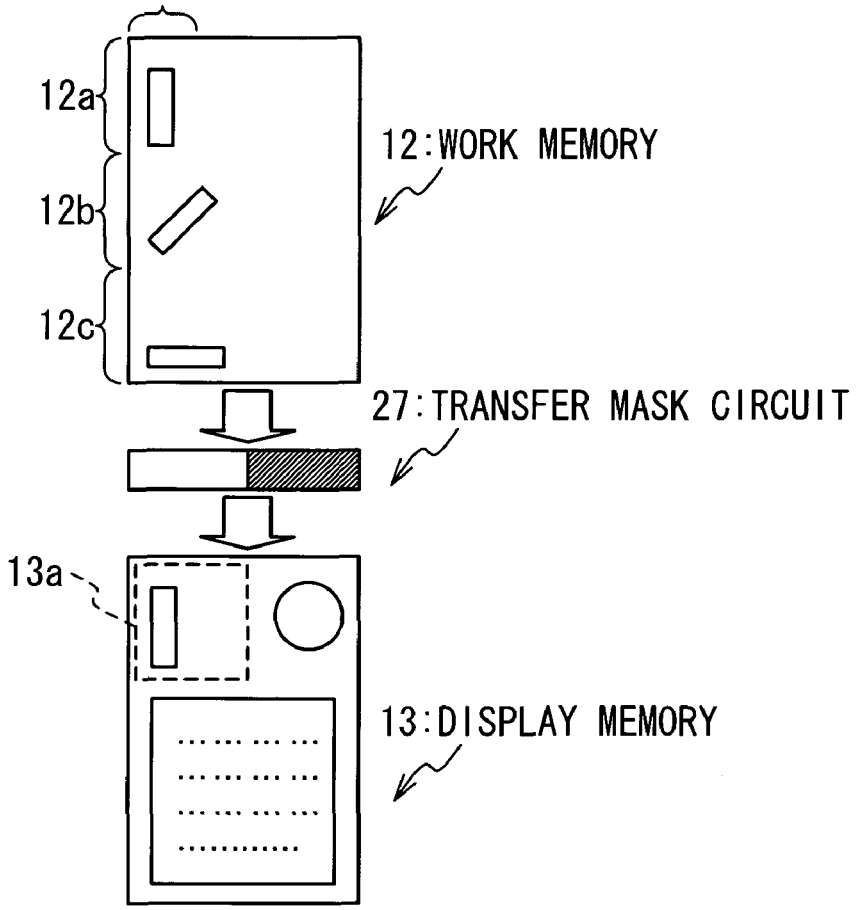
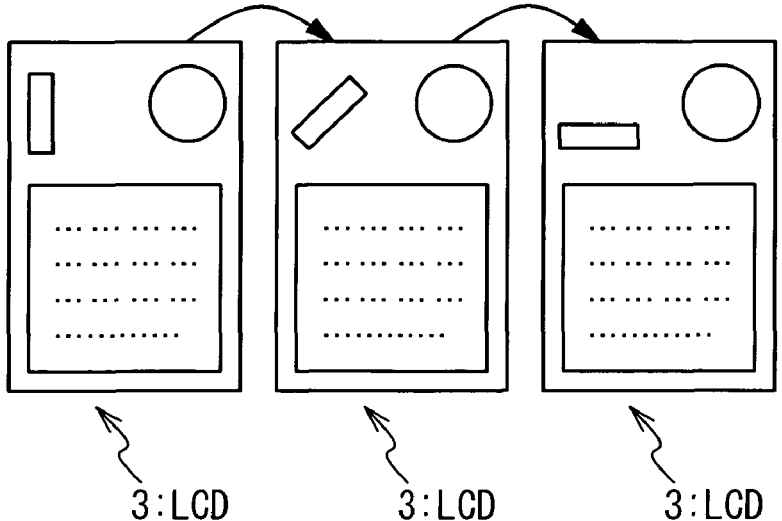

Fig. 18
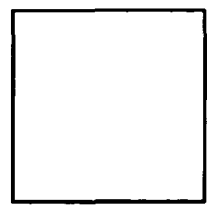 WRITE IMAGE STORED IN WORK MEMORY 12
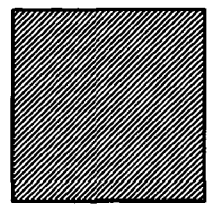 BLACK IMAGE STORED IN DISPLAY MEMORY 13
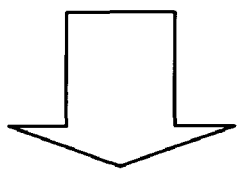 DISPLAY ALTERNATELY
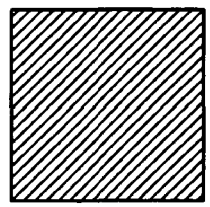 GRAY IMAGE DISPLAYED ON LCD 3

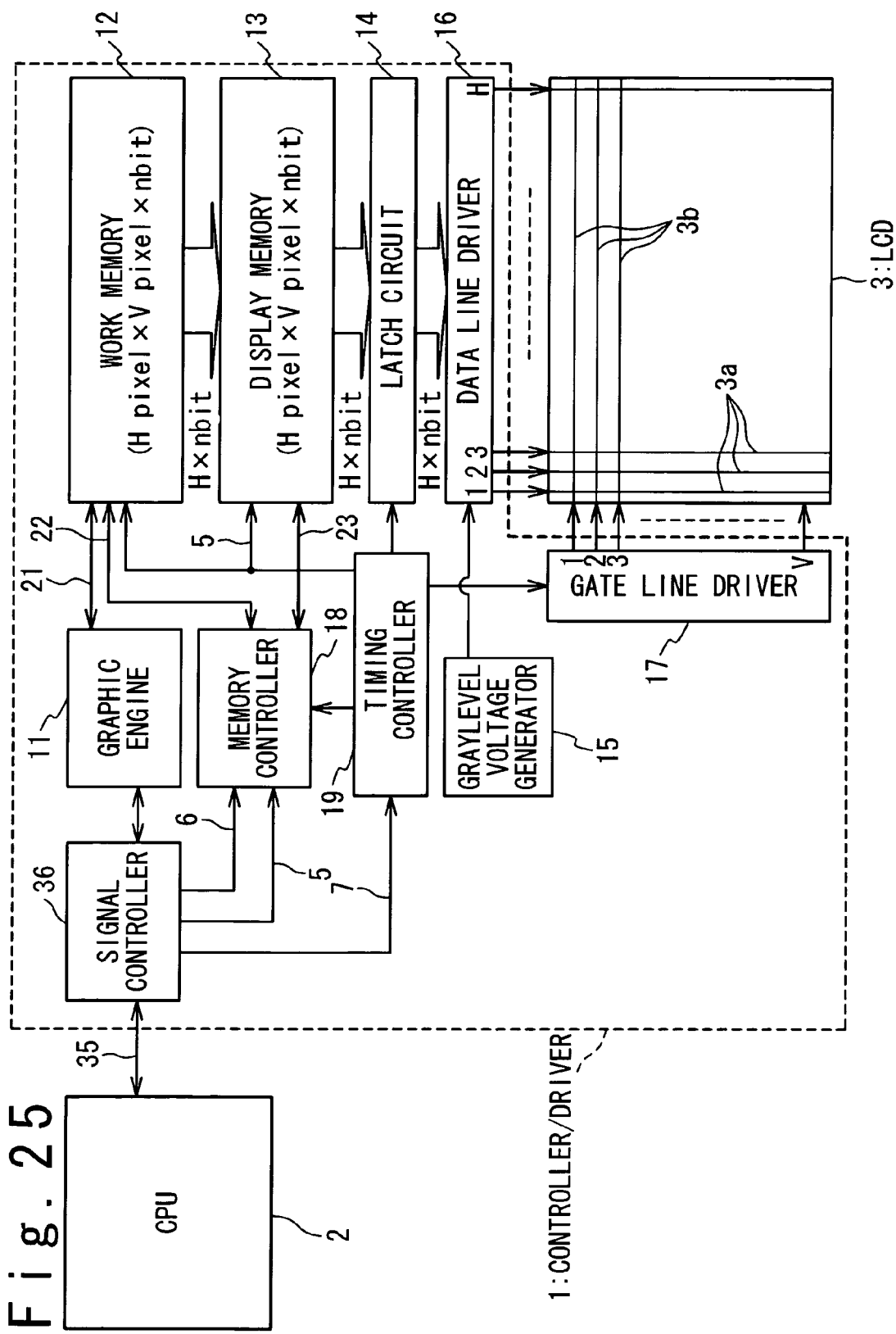

CONTROLLER DRIVER AND DISPLAY APPARATUS USING THE SAME

TECHNICAL FIELD

The present invention is generally related to controller/drivers used for driving display panels, particularly, to controller/drivers including display memories for storing image data.

BACKGROUND ART

Controller/drivers used for driving display panels are often comprised of display memories for storing image data. Such controller/drivers receive image data representing images to be display on display panels from image processors, and temporally store the received image data into display memories. The controller/drivers are responsive to the image data stored in the display memories for driving data lines of display panels.

In order to achieve increased grayscale capacity and improved smoothness of moving pictures, increased image data are required to be provided for controller/drives. Increase in the number of the graylevels of image data requires the number of data bits of image data for each pixel, and this leads to the increase in the amount of image data. Additionally, improvement of smoothness of moving pictures requires numbers of frames per unit of time, and this also leads to increase in the amount of image data.

Nevertheless, the increase in the amount of image data is undesirable because it results in the power consumption of controller/drivers. Controller/drives consume power when receiving image data, and therefore increase in image data increases the power consumption. The increased power consumption is undesirable especially for portable electronic devices, including cell phones and PDAs (personal data assistants).

Japanese Open Laid Patent Application No. P2002-182627A discloses a controller/driver for reducing power consumption. The disclosed controller/driver includes a latch circuit which latches image data and a display memory which does not include any sense amplifiers. The controller/driver writes a plurality of data bits into the display memory at the same time, and thereby reduces the number of times of activation of word lines within the display memory, that is the number of access times to the display memory. This effectively reduces power consumption of the controller/driver.

As mentioned before, reduction in power consumption is critically important for portable electronic devices, including cell phones and PDAs; therefore, it would be desirable if controller/drivers achieve further reduction in power consumption. There is a need for controller/drivers that further reduces power consumption.

DISCLOSURE OF INVENTION

Therefore, an object of the present invention is to provide a technique for reducing image data transmission to controller/drivers as well as achieving the display of high grayscale images on liquid crystal displays; the reduction in the data transmission effectively reduces power consumption of controller/drives.

Another object of the present invention is to provide a technique for reducing image data transmission to controller/drivers as well as achieving improved image quality and decreased latencies from the input of image data to the display of the image data.

In an aspect of the present invention, a controller/driver is composed of a work memory, a graphic engine converting externally received image data into first bitmap data, and storing the first bitmap data in the work memory, a display memory receiving and storing second bitmap data developed from the bitmap data stored in the work memory, and a driver circuit which receives the second bitmap data from the display memory, and drives a display panel in response to the second bitmap data received from the display memory.

This architecture is effective for reducing the size of the image data transmitted to the controller/driver. Additionally, this architecture, using the work memory as the work area, allows the controller/driver to display a complete image on the display panel regardless of the progress in processing of the image data within the graphic engine.

The image data is preferably described in a vector format.

Instead, it is also preferable that the image data is composed of compressed image data.

The second bitmap data may be developed on the display memory through data transfer of the first bitmap data from said work memory to the display memory. In this case, the data transfer of the first bitmap data from the work memory to the display memory is preferably performed such that a set of data bits of the bitmap data are transferred at the same time.

More preferably, the first bitmap data includes a plurality of line data each associated with a line of pixels of an image represented by the second bitmap data to be displayed, and the data transfer of the first bitmap data from the work memory to the display memory is performed such that each of the line data is transferred at the same time.

In this case, it is more preferable that the controller/driver further includes a latch receiving the line data from the work memory, and temporally storing the received line data, and the display memory receives the line data from the latch.

The data transfer of the first bitmap data from the work memory to the display memory is controlled so as to be synchronous with readout of the second bitmap data from the display memory to the driver circuit. Specifically, the data transfer of the first bitmap data from the work memory to the display memory is preferably initiated in response to activation of a frame synchronization signal indicating to start displaying each image frame. Additionally, the data transfer of the first bitmap data from the work memory to the display memory is controlled so as not to overrun the readout of the second bitmap data from the display memory to the driver circuit.

In an preferred embodiment, the number of bit lines within the work memory is same as that of bit lines within the display memory, and the bit lines within the work memory are respectively connected to the of bit lines within the display memory. It is more preferable that the number of the word lines within the work memory is identical to that of the word lines within the display memory.

In this case, the controller/driver preferably includes a controller controlling the work memory, and the display memory, and the driver circuit, and the controller is adapted to deactivates the display memory to allow the first bitmap data to be transmitted to the driver circuit through the second bit lines. In a further preferred embodiment, the controller is adapted to successively change portions of the first and second bitmap data stored in the work memory and the display memory to be transferred to the driver circuit.

The controller/driver is preferably further comprised of a processing circuit which processes the first bitmap data received from the work memory to develop the second bitmap data to be displayed and stores the developed bitmap data in the display memory. It is also preferable that the controller/ driver further includes another processing circuit which processes the second bitmap data stored in the display memory, and provides the processed bitmap data for the work memory.

In another aspect of the present invention, a display device is composed of a controller/driver, and first and second display panels. The first display panel includes a plurality of first data lines, and a plurality of first gate lines. Correspondingly, the second display panel includes a plurality of second data lines respectively connected to the first data lines, and a plurality of second gate lines. The controller driver includes a work memory comprising a plurality of first bit lines, a graphic engine converting externally received image data into first bitmap data to store into the work memory, a display memory storing a second bitmap data and comprising a plurality of second bit lines respectively connected to the first bit lines, a data line driver driving the first data lines, a first gate line driver driving the first gate lines, a second gate line driver driving the second gate lines, and a controller circuit controlling the work memory, the display memory, the data line driver, and the first and second gate line drivers. The controller circuit is adapted to deactivate the display memory to thereby allow the first bitmap data to be transmitted to the data line driver through the second bit lines, and to allow the second bitmap data to be transmitted from the display memory to the data line driver. The controller circuit is also adapted to control the first and second gate line drivers to allow the data line driver to drive the second data lines of the second display panel through the first data lines of the first display panel.

Preferably, the controller circuit is adapted the first and second gate line drivers to allow the same image to be displayed on the first and second display panels in response to one of the first and second bitmap data.

The present invention effectively reduces the image data transmission to controller/drivers, and thereby reduces the power consumption of the controller/drivers while achieving the display of high grayscale images on liquid crystal displays.

Also, the present invention effectively reduces the data transmission to controller/drivers while achieving improved image quality and decreased latencies from the input of image data to the display of the image data on the display panel.

BRIEF DESCRIPTION OF DRAWINGS

FIG. 16 is a diagram illustrating still another exemplary operation of the controller/driver in the fourth modification;

FIG. 18 is a diagram illustrating an exemplary operation of controller/driver in a sixth modification of the present invention;

FIG. 25 is a block diagram illustrating a display device in an eleventh modification of the present invention.

BEST MODE FOR CARRYING OUT THE INVENTION

Preferred embodiments of controller/drivers in accordance with the present invention will be described below in details with reference to the attached drawings.

Figure 1:
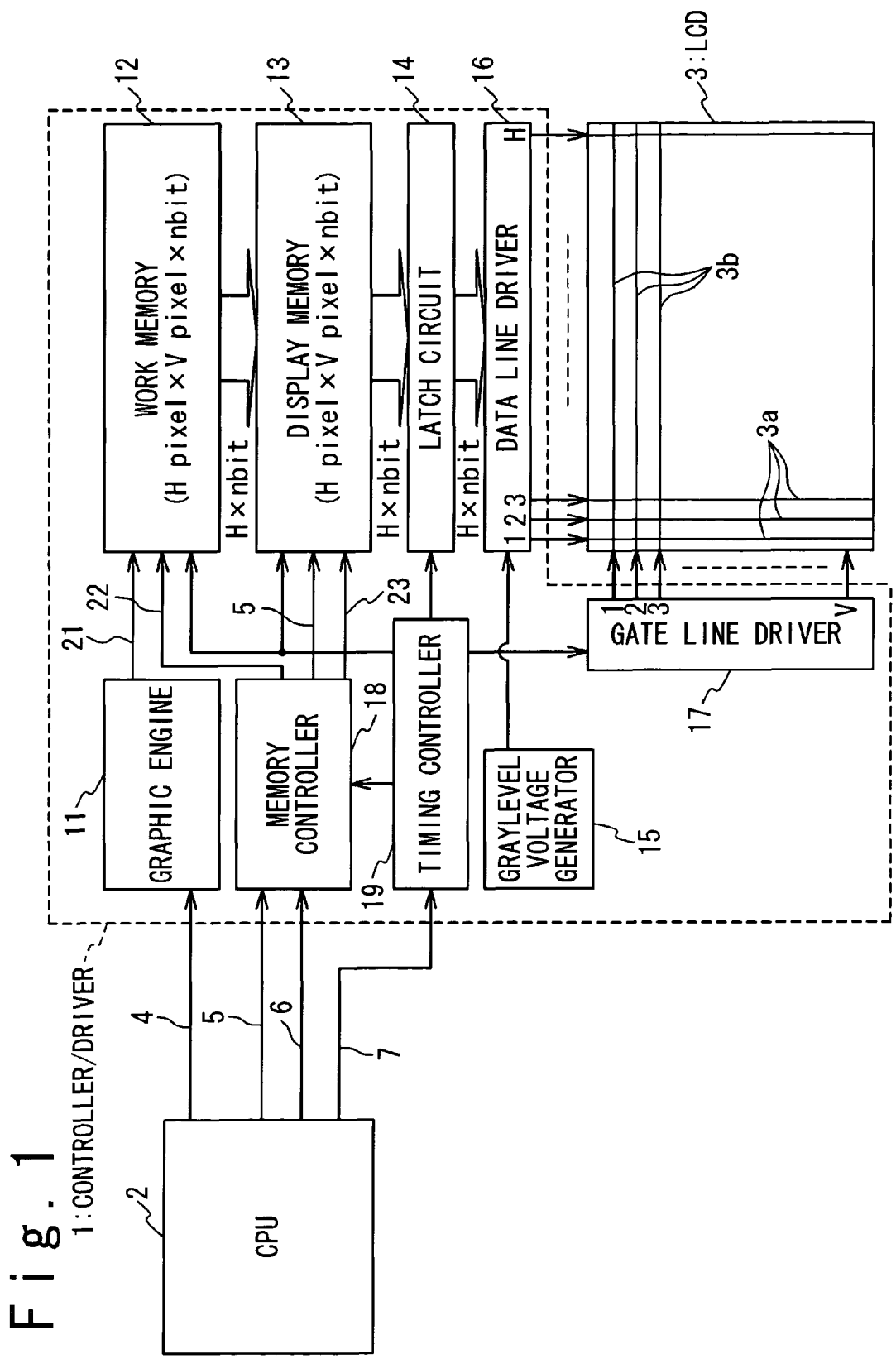
FIG. 1 is a block diagram of a display device including a controller/driver in one embodiment of the present invention.

FIG. 1 is a block diagram of a display device including a controller/driver in one embodiment of the present invention. The display device includes a controller/driver 1, and a CPU 2. The controller/driver 1 receives vector data 4, which is image data described in a vector format, and drives an LCD (liquid crystal display) 3, which is a kind of display panels, in response to the vector data 4. The LCD 3 includes H data lines 3a and V gate lines 3b. Pixels are disposed at respective intersections of data lines 3a and gate lines 3b; the LCD 3 includes pixels arranged in V lines (or rows) and H columns.

The vector data 4 is composed of vector graphic commands, which are simply referred to as commands, hereinafter, each describing a graphic primitive within the image to be displayed. Typically, the vector data 4 may be described in the SVG™ (Scalable Vector Graphic) format or the Macromediaflash™ format.

The use of the vector data 4 for providing image from the CPU 2 to the controller/driver 1 effectively reduces the data transmission from the CPU 2 to controller/driver 1. The data amount of the vector data 4 required for expressing bitmap data is mostly smaller than that of bitmap data itself.

The controller/driver 1 is also adapted to drive the LCD 3 in response to bitmap data. If necessary, the CPU 2 provides the bitmap data 5 for the controller/driver 1, and the controller/driver 1 drives the LCD 3 in response to the provided bitmap data 5.

The following is a detailed description of the controller 1. The controller/driver 1 is composed of a graphic engine (image processor) 11, a work memory 12, a display memory 13, a latch circuit 14, a graylevel voltage generator 15, a data line driver 16, and a gate line driver 17.

The graphic engine 11 and the work memory 12 are used to generate bitmap data representing the display image on the LCD 3 from the vector data 4, which is sequentially received from the CPU 2. The number of bit lines within the work memory 12 is H multiplied by n, while the number of word lines is V, where n is the number of data bits of pixel data, which represents the graylevel of each pixel, V is the number of the lines of the pixels, and H is the number of the columns of the pixels. Typically, eight data bits are used to represent respective graylevels of red, green, and blue; in this case, n is 24. The work memory 12 is adapted to store image data of one frame in the bitmap format.

The graphic engine 11 is designed to sequentially "draw" the graphic primitives onto the memory space of the work memory 12 as indicated by the commands within the vector data 4. Specifically, the graphic engine 11 sequentially interprets the commands within the vector data 4 to recognize the graphic primitives within the image to be displayed, and generates bitmap data 21 of the graphic primitives. The graphic engine 11 sequentially writes the bitmap data 21 into the work memory 12. When one of the graphic primitives overlaps another, the associated portion of the bitmap data within the work memory 12 is rewritten. In this manner, the bitmap data of the desired image to be displayed on the LCD 3 is gradually developed in the work memory 12.

The work memory 12 is only used as a work area; the bitmap data stored in the work memory 12 is not directly used for displaying the desired image on the LCD 3. This aims to avoid the bitmap data stored in the work memory 12 being used for displaying the desired image before the bitmap data is completed on the work memory 12. Driving the LCD 3 in response to the incomplete data undesirably results in that an incomplete image is displayed on the LCD 3. It is not until a complete set of the commands associated with a frame are processed by the graphic engine 11 that the "complete" bitmap data of the desired image is developed onto the work memory 12. After the "complete" bitmap data is developed, the "complete" bitmap data is transferred from the work memory 12 to the display memory 13, and used for displaying the desired image on the LCD 3.

The display memory 13 is used to store the "complete" bitmap data received from the work memory 12. Displaying the image on the LCD 3 is based on the "complete" bitmap data stored in the display memory 13. This allows the desired image to be displayed on the LCD 3 regardless of the progress in the interpretation of the vector data 4, because the display memory 13 only stores the complete bitmap data. As is the case of the work memory 12, the display memory 13 is composed of H×n bit lines, and V word lines. The display memory 13 is adapted to store image data of one frame in the bitmap format.

The latch circuit 14, the graylevel voltage generator 15, and the data line driver 16 are used for driving the data lines 3a within the LCD 3 in response to the bitmap data stored in the display memory 13. The latch circuit 14 sequentially latches the bitmap data stored in the display memory 13 in units of lines of the images and forwards the latched bitmap data to the data line driver 16. The graylevel voltage generator 15 develops a set of graylevel voltages used for achieving grayscale, which are respectively associated with graylevels. Driving the data lines 3a involves selecting the graylevel voltages, and providing the selected voltages to the data lines 3a. The gate line driver 17 sequentially drives the gate lines 3b within the LCD 3 to scan the gate lines 3b. Scanning the gate lines 3b achieves sequential drives of the pixels on the LCD 3 in unit of pixel lines.

The read-out of the bitmap data stored in the display memory 13 is performed at a predetermined frame frequency in synchronization with the scanning of the gate lines 3b. This results in that the images displayed on the LCD 3 are updated at the frame frequency.

In order to control the work memory 12, the display memory 13, the latch circuit 14, the data line driver 16 and the gate line driver 17, the controller/driver 1 includes a memory controller 18 and the timing controller 19. The memory controller 18 is responsive to a control signal 6 received from the CPU 2 for generating control signals 22 and 23 used for controlling the work memory 12 and the display memory 13, respectively. The timing controller 19 is responsive to a timing control signal 7 received from the CPU 2 for controlling operation timings of the work memory 12, the display memory 13, the latch circuit 14, and the gate line driver 17. The timing control signal 7 includes a frame synchronization signal (not shown) In response to activation of the frame synchronization signal, the timing controller 19 controls the display memory 13, the latch circuit 14, and the gate line driver 17 to initiate the display of the associated frame of the desired image on the LCD 3.

The memory controller 18 is adapted to write the bitmap data 5, which is received from the CPU 2, into the display memory 13. This allows the image displayed on the LCD 3 to be partially modified through partially updating the bitmap data stored in the display memory 13.

Reducing the time of transmitting the "complete" bitmap data from the work memory 12 to the display memory 13 is effective for shortening latency from the reception of the vector data 4 by the controller/driver 1 to the completion of the display of the associated image on the LCD 3. In order to transfer the bitmap data in a reduced duration, the work memory 12 includes H×n data outputs for outputting pixel data associated with a line of the pixels at the same time, and the display memory 13 includes H×n data inputs for receiving the pixel data of a line of the pixels at the same time.

Figure 2:
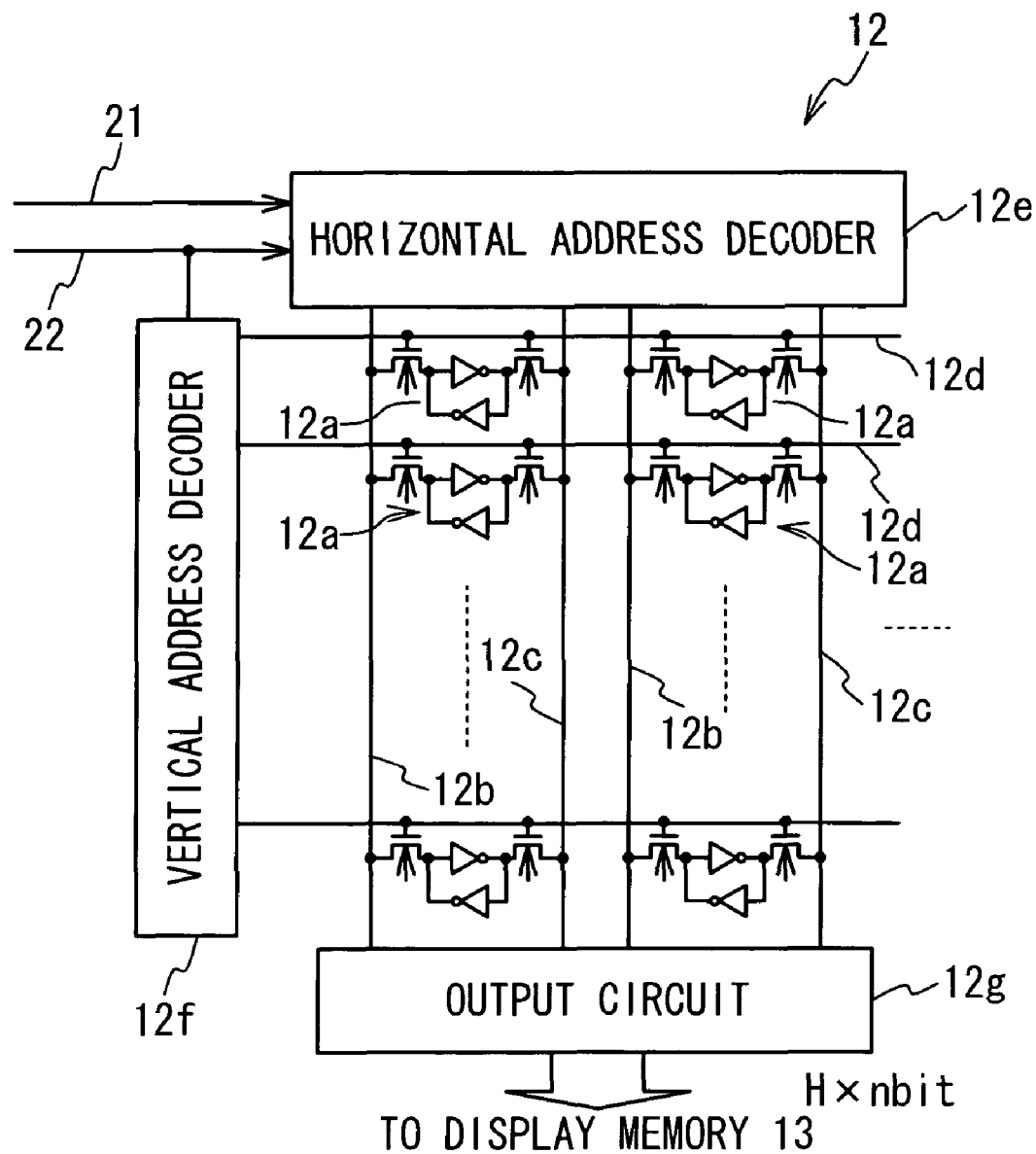
FIG. 2 is a circuit diagram of a work memory within the controller/driver.

FIG. 2 illustrates the structure of the work memory 12. The work memory 12 is typically composed of an SRAM (static random access memory). Instead, a DRAM (dynamic random access memory) or other memories may be used as the work memory 12.

The work memory 12 includes H×V×n memory cells 12a arranged in V lines and H×n columns, H×n bit lines 12b, H×n complementary bit lines 12c, V word lines 12d, a horizontal address decoder 12e, a vertical address decoder 12f, and an output circuit 12g. The memory cells 12a are disposed at the respective intersections of the bit lines 12b and the word lines 12c. Each memory cell 12a is connected to the associated bit line 12b and complementary bit line 12c, and additionally connected to the associated word line 12d. The horizontal and vertical address decoders 12e and 12f are used to select the memory cells 12a to be accessed. The bitmap data 21 received from the graphic engine 11 are stored in the desired ones of the memory cells 12a. The bit lines 12b and the complementary bit lines 12c are connected to the output circuit 12g.

The output circuit 12g is designed to output pixel data from H×n memory cells connected to the same word line 12d at the same time. In response to the activation of a specific word line 12d, the memory cells 12a connected to the specific word line 12d are activated and connected to the bit lines 12b and the complementary bit line 12c. The activated memory cells 12a outputs the data stored therein onto the associated bit lines 12b. The output circuit 12g is designed to output the data developed on all the bit lines 12b at the same time. This allows the work memory 12 to output the pixel data associated with the desired pixel line at the same time.

Figure 3:
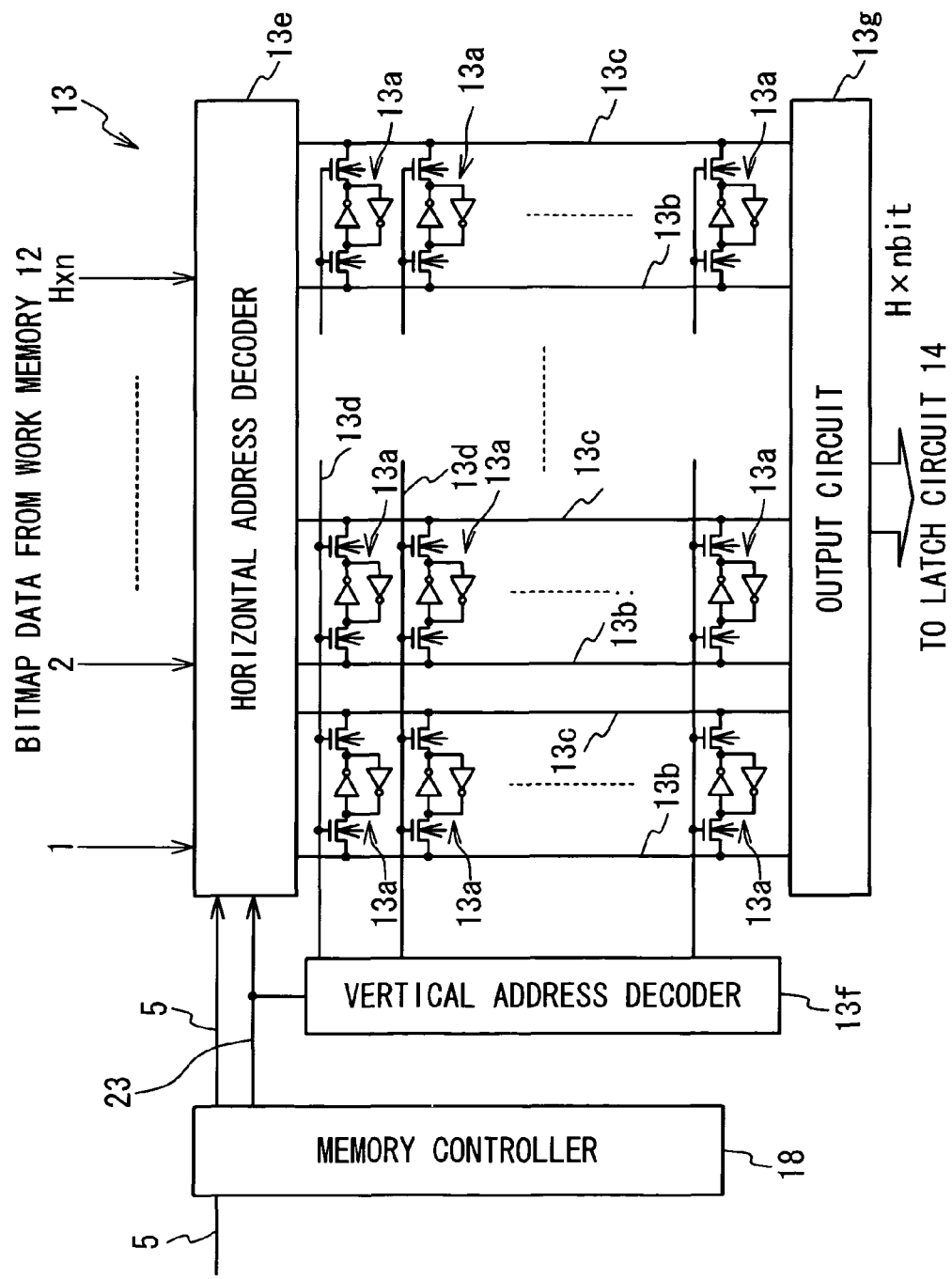
FIG. 3 is a circuit diagram of a display memory within the controller/driver.

FIG. 3 illustrated the structure of the display memory 13. The display memory 13 is typically composed of a SRAM. Instead, a DRAM or other memories may be used as the display memory 13.

Similarly to the work memory 12, the display memory 13 includes H×V×n memory cells 13a arranged in V lines and H×n columns, H×n bit lines 13b, H×n complementary bit lines 13c, V word lines 13d, a horizontal address decoder 13e, a vertical address decoder 13f, and an output circuit 13g. The memory cells 13a are disposed at the respective intersections of the bit lines 12b and the word lines 12c. Each of the memory cells 13a is connected to the associated bit line 13b and complementary bit line 13c, and additionally connected to the associated word line 13d. The horizontal and vertical address decoders 13e and 13f are used to select the memory cells 13a to be accessed in response to the control signal 23 received from the memory control circuit 18. The bit lines 13b and the complementary bit lines 13c are connected to the output circuit 13g. The output circuit 13g is designed to output the pixel data associated with the desired pixel line at the same time.

The horizontal address decoder 13e is designed to receive H×n data bits from the work memory 12 at the same time. Upon receiving the H×n data bits, the horizontal address decoder 13e outputs the received data bits to the associated bit lines 13b, and additionally outputs the complementary data bits of the received data bits to the associated complementary bit lines 13c. Desired one of the word line 13d is then selected to activate the memory cells 13a connected to the selected word line 13d, and the received data bits are written into the memory cells 13c associated with the desired line. This allows the display memory 13 to receive the pixel data associated with the desired pixel line of the image at the same time.

The aforementioned architecture of the work memory 12 and the display memory 13 achieves fast transfer of the bitmap data from the work memory 12 to the display memory 13.

Figure 4:
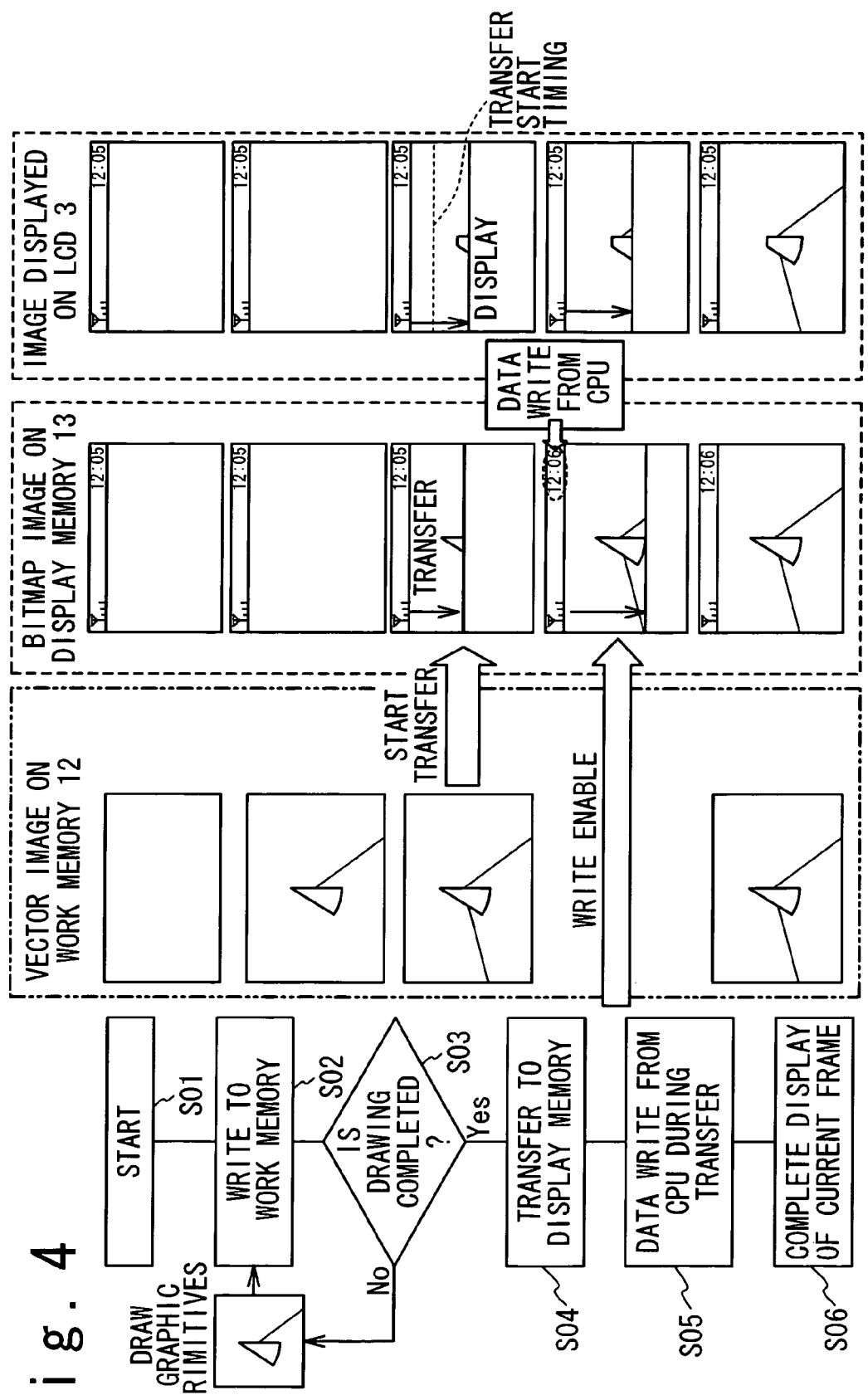
FIG. 4 is a diagram illustrating an operation of the controller/driver.

FIG. 4 illustrates the operation of the controller/driver 1 in this embodiment. The bitmap data is obtained from the display memory 13 at the predetermined frame frequency, and images are displayed on the LCD 3 in response to the obtained bitmap data. In detail, the image display is achieved as described below. When the CPU 2 initiates to provide the vector data 4 for the controller/driver 1 at Step S01, the graphic engine 11 "draws" the graphic primitives onto the work memory 12 in response to the command within the vector data 4 at Step S02. In other word, the graphic engine 11 sequentially writes the bitmap data 21 representing the graphic primitives associated with the commands within the vector data 4. After completing the "drawing" at Step S03, the "complete" bitmap data developed on the work memory 12 is started to be transferred to the display memory 13 at Step S03. As mentioned above, the bitmap data is transferred by H×n data bits, that is, by a line of the pixels, and this achieves the fast data transfer between the work memory 12 and the display memory 13. The image displayed on the LCD 3 is updated in response to the transferred bitmap data.

The image displayed on the LCD 3 may be partially modified through replacing the associated portion of the bitmap data stored in the display memory 13 with the bitmap data 5 received from the CPU 2, as indicated by Step S05. Upon receiving the bitmap data 5 from the CPU 2, the memory controller 18 writes the received bitmap data 5 into the desired address of the display memory 13. This allows the image displayed on the LCD 3 to be partially modified. When the data write of the bitmap data 5 conflicts the data write of the bitmap data transferred from the work memory 12 to the display memory 13, the data write of the bitmap data 5 is preferentially performed.

The image represented by the vector 4 is finally displayed on the LCD 3 at Step S06 through transferring the complete bitmap data from the work memory 12 to the display memory 13, and driving the LCD 3 in response to the bitmap data stored in the As shown in the right of FIG. 4, starting the transfer of the bitmap data from the work memory 12 to the display memory 13 independently of the read-out of the display memory 13 may result in that an incomplete image, that is, a portion of the image to be displayed, is undesirable displayed on the LCD 3 after the transfer of the bitmap data to the display memory 13.

Figure 5:
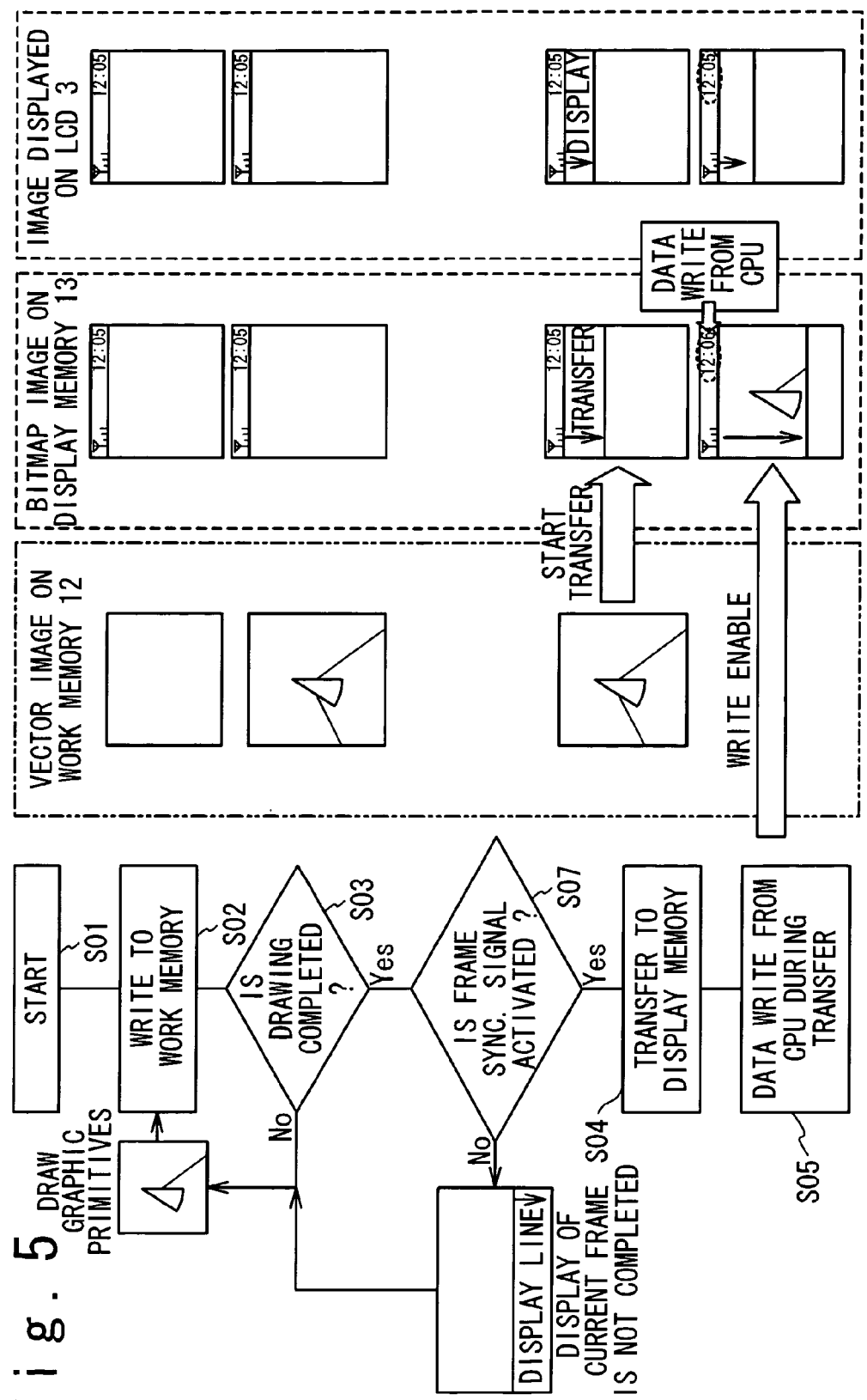
FIG. 5 is a diagram illustrating a preferred operation of the controller/driver.

In order to avoid an incomplete image being displayed on the LCD 3, as shown in FIG. 5, the transfer of the bitmap data from the work memory 12 to the display memory 13 is preferably synchronous with the read-out of the bitmap data from the display memory 13. In order to achieve the synchronization of the data transfer and data read, it would be desirable if the memory controller 18 and the timing controller 19 control the work memory 12, the display memory 13, the latch circuit 14, and the gate line driver 17 as described below.

As is the case of FIG. 4, the graphic engine 11 starts to "draw" the graphical primitives associated with the commands within the vector data 4 onto the work memory 12 at Step S02, when the CPU 2 starts to provide the vector data 4 to the controller/driver 1 at Step S01. After the "drawing" is completed at Step S03, the work memory 12 is placed into standby at Step S07 till the display of the final line of the current image on the LCD 3 is completed, that is, till the scanning of the gate lines 3b is completed up to the final gate line. After the scanning up to the final gate line is completed, the transfer of the "complete" bitmap data from the work memory 12 to the display memory 13 is initiated from pixel data of the top pixel line in response to the activation of the frame synchronization signal received from the CPU 2. After the following blanking period, the controller/driver 2 starts displaying the image in response to the bitmap data stored in the display memory 13. The display of the bitmap data stored in the display memory 13 is started from the top pixel line of the displayed image.

Figure 6:
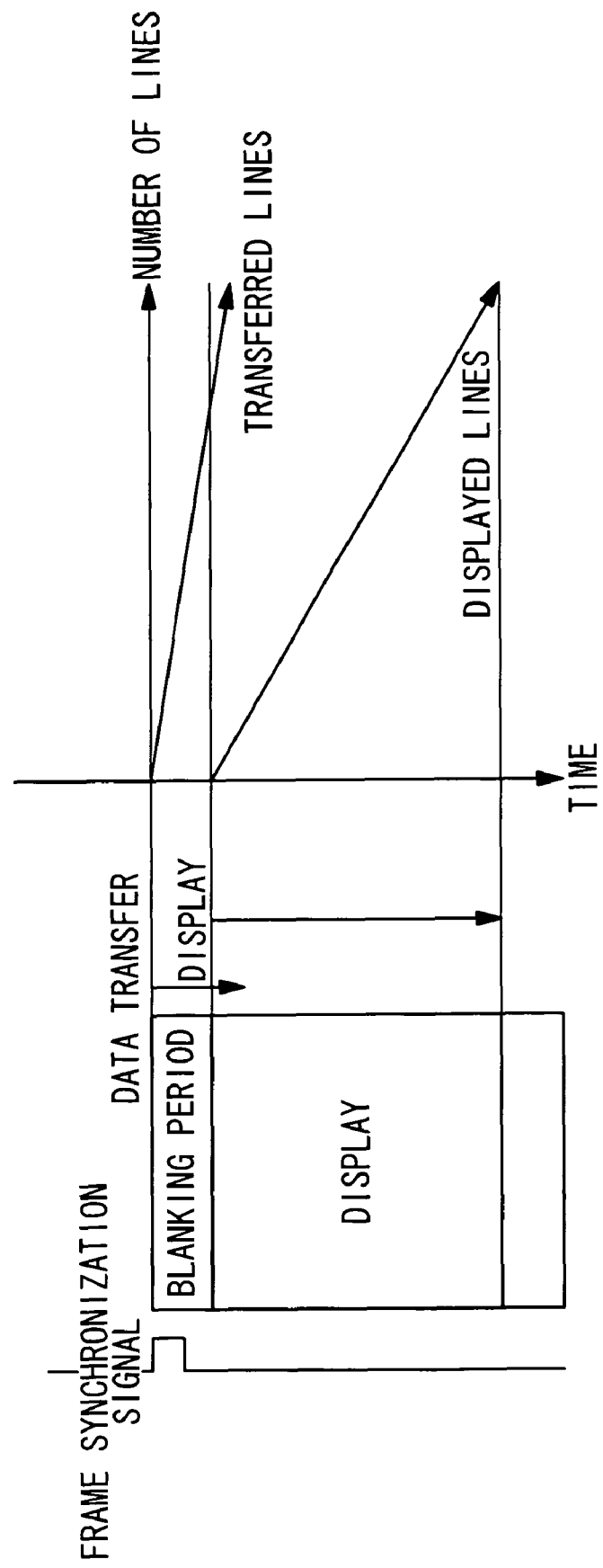
FIG. 6 is a diagram illustrating a preferred procedure of transmitting image data in units of pixel lines.

FIG. 6 is a graph illustrating the number of the lines for which the transfer of the associated pixel data is completed, and the number of the lines for which the display of the associated pixel data is completed. The horizontal axis of the graph represents the number of lines, and the vertical axis represents the time. The transmission rate of the bitmap data from the work memory 12 to the display memory 13 is adjusted to be faster than the display rate of the bitmap data stored in the display memory 13. This avoids the line whose pixel data is being transferred overtaking the line whose pixel data is being displayed, and thereby avoids the images before and after the data transfer being mixed and displayed on the LCD 3.

In summary, the display device in this embodiment uses the vector data 4 for transferring images transfer from CPU 2 to the controller 1, and thereby effectively reduces the data transfer therebetween. Additionally, the display device in this embodiment includes the work memory 12 used for developing the bitmap data from the vector data 4 in addition to the display memory 13, which is used for storing the bitmap data to be displayed, and thereby achieves displaying the complete image on the LCD 3 independently of the process of the vector data 4. Finally, the display device in this embodiment transfers the bitmap data from the work memory 12 to the display memory 13 in units of the pixel lines, and this effectively reduces the latency from the input of the vector data 4 to the display of the associated image on the LCD 3.

In this embodiment, other compressed image data may be used for transferring images from the CPU 2 to the controller/driver 1 in place of the vector data 4, including JPEG (joint photographic experts group), MPEG (motion picture experts group) PNG (portable network graphics), GIF (Graphics Interchange Format), FXT1™, and S3CT (S3 texture compression) data. In this case, the function of the graphic engine 11 is modified in accordance with the compression image data format; the graphic engine 11 decompress the compression image data and writes the decompressed image data into the work memory 12. The use of a compressed image data format, which reduces the image data size compared to the bitmap data format, effectively reduces the data transfer from the CPU 2 to the controller/driver 1.

It is advantageous if the graphic engine 11 is additionally adapted to compress the bitmap data stored in the work memory 13. Allowing the graphic engine 11 to both compress and decompress image data is effective for reducing the data transfer between the controller/driver 1 and the CPU 2.

It is understood that the unit of the data transfer from the work memory 12 to the display memory 13 is limited to one line of the pixels of the image; transferring a plurality of data bits of the bitmap data from the work memory 12 to the display memory 13 at the same time effectively reduces the latency from the input of the vector data 4 to the display of the associated image on the LCD 3. It should be noted, however, the architecture that transfers the bitmap data in units of pixel lines is preferable because of the improved simplicity of circuits used for transferring the bitmap data as well as the improved transfer rate.

The work memory 12 and the display memory 13 may include different numbers of word lines and bit lines. Even if the work memory 12 and the display memory 13 include different numbers of word lines, appropriate control of the data transfer from the work memory 12 to the display memory 13 achieves the desired data transfer mentioned above.

It should be noted, however, that it is advantageous for facilitating the data transfer from the work memory 12 to the display memory 13 that the work memory 12 and the display memory 13 includes the same number of word lines and bit lines. Such architecture allows one-to-one connections between the bit lines of the work memory 12 and the display memory 13, and thereby effectively simplifies the circuits used for transferring the bitmap data. Additionally, this architecture allows the work memory 12 and the display memory 13 to be addressed by the same address; this eliminates the need for the memory controller 18 to separately provide the addresses for the work memory 12 and the display memory 13 to indicate the access destination. This preferably facilitates the address generation by the memory controller 18.

The followings are description of preferable modifications of the controller/driver 1.

First Modification

Figure 7:
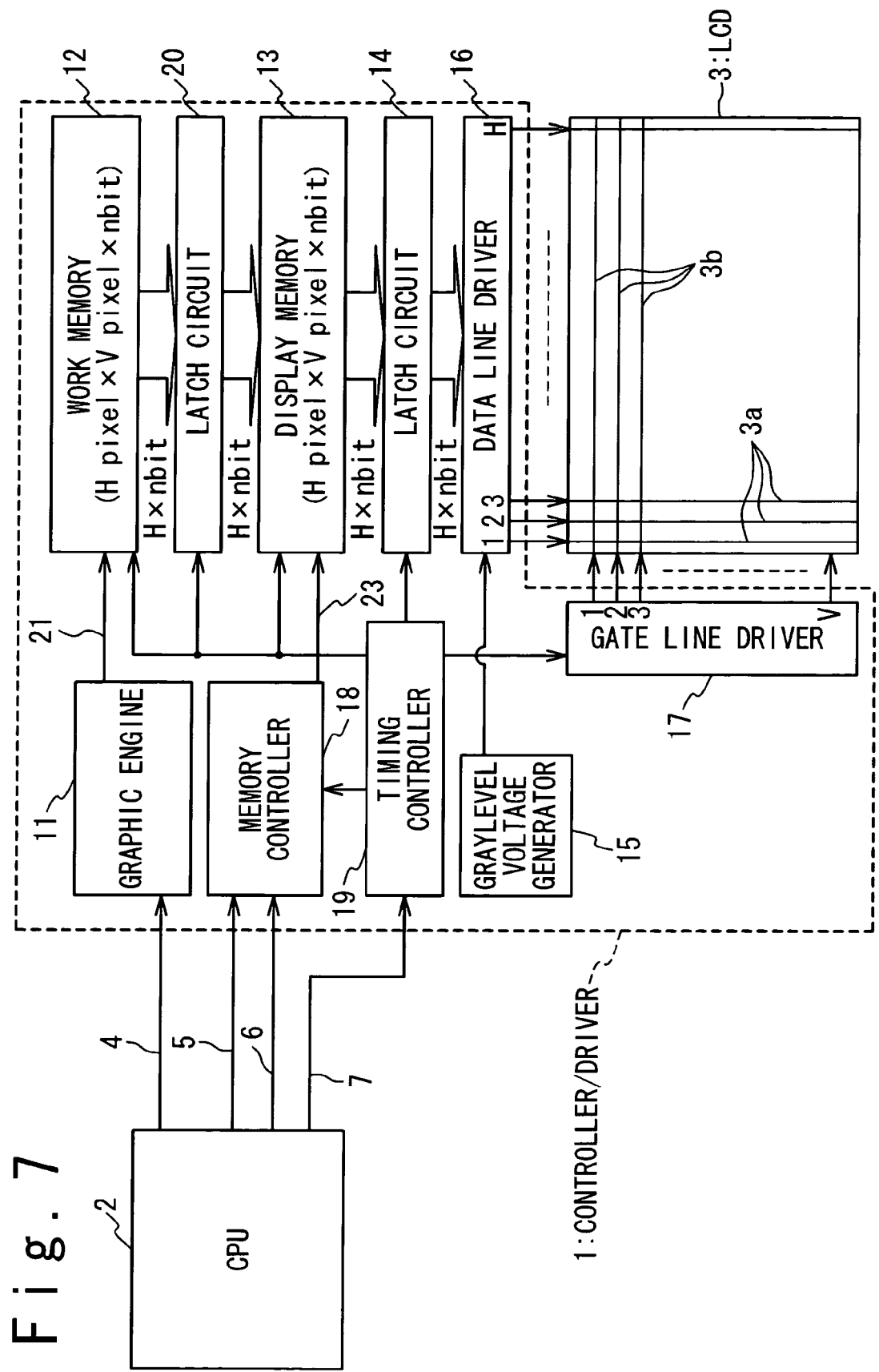
FIG. 7 is a block diagram of a display device in a first modification of the present invention.

With reference to FIG. 7, it is advantageous that a latch circuit 20 is inserted between the work memory 12 and the display memory 13. The latch circuit 20 receives the pixel data associated with the target line of the image from the work memory 12 and temporary stores therein the received pixel data. The latch circuit 20 effectively reduces the duration necessary for the work memory 12 to output the pixel data of the desired line. This preferably reduces the working duration of the work memory 12. Additionally, the latch circuit 20 preferably eliminates a need for operating the work memory 12 and the display memory 13 at the same time during the transfer of the bitmap data from the work memory 12 to the display memory 13.

Second Modification

Figure 8:
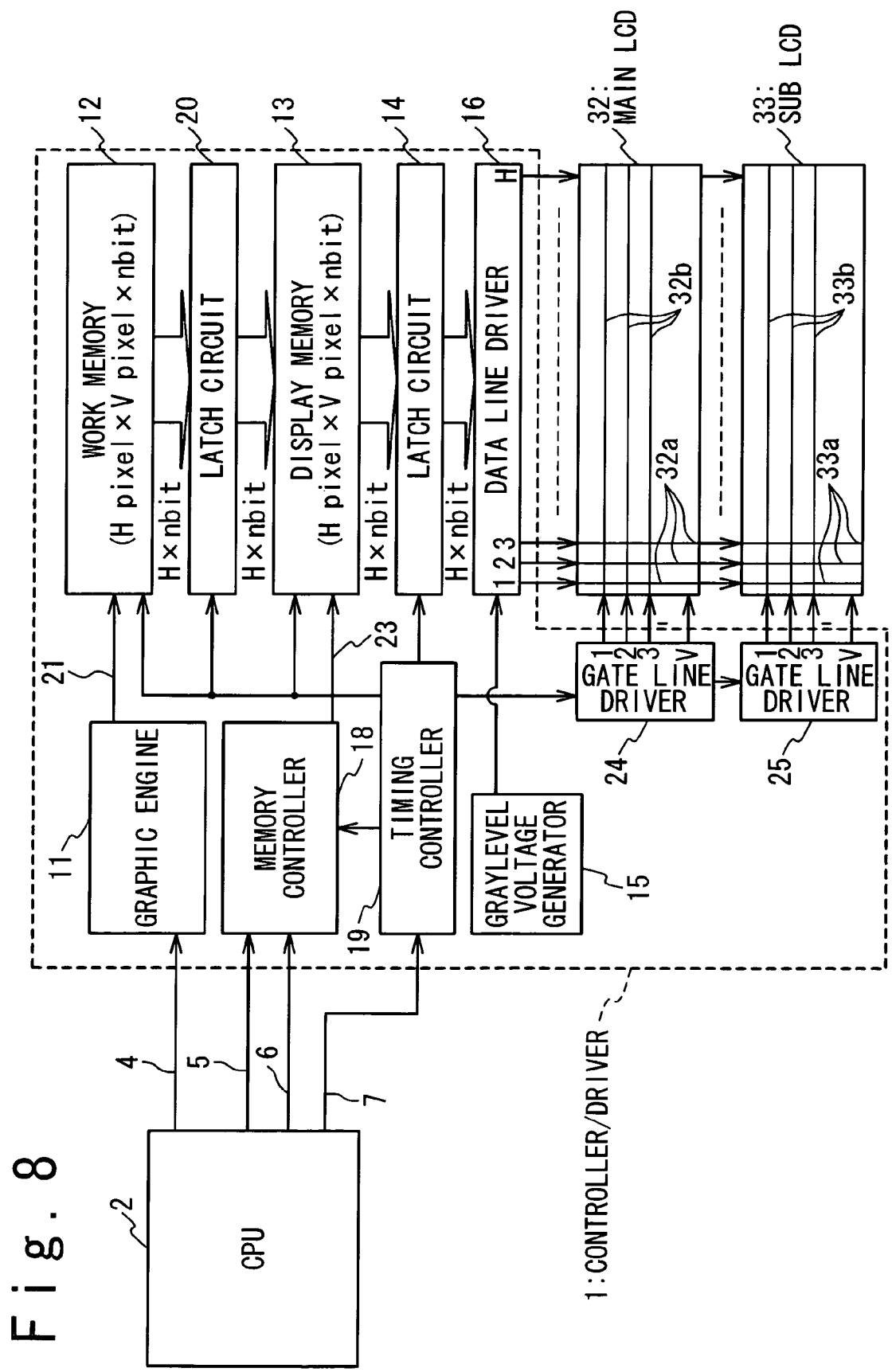
FIG. 8 is a block diagram of a display device in a second modification of the present invention.

FIG. 8 illustrates the structure of the controller/driver 1 in a second modification of this embodiment. In this modification, the controller/driver 1 is adapted to drive a pair of LCDs using the work memory 12 and the display memory 13. Other than this exception, the controller/driver 1 in this modification is designed similarly to that shown in FIG. 7.

One of the LCDs is referred to as a main LCD 32, and the other is referred to as the sub LCD 33. The main LCD 32 includes H data lines 32a and V gate lines 32b. Pixels (not shown) are disposed at the respective intersections of the data and gate lines 32a and 32b. Correspondingly, the sub LCD 33 includes H data lines 33a and V gate lines 33b, and pixels (not shown) are disposed at the respective intersections of the data and gate lines 33a and 33b.

In order to drive the two LCDs: the main and sub LCDs 32 and 33, the controller/driver 1 includes a pair of gate line drivers 24 and 25. The gate line driver 24 is used to drive the gate lines 32b within the main LCD 32, while the gate lien driver 25 is used to drive the gate lines 33b within the sub LCD 33.

Although being adapted to drive two LCDs, the controller/driver 1 includes the single data line driver 16. This owes the architecture in which the data line driver 16 is connected to the data lines 32a of the main LCD 32, and the data lines 32a are respectively connected to the data lines 33a of the sub LCD 33. The data line driver 16 is adapted to drive the data lines 33a of the sub LCD 33 through the data lines 32a of the main LCD 33.

In this modification, the controller/driver 1 makes use of the work memory 12 and the display memory 13, which are both adapted to store pixel data for one frame, to drive the main and sub LCD 32 and 33; one of the work memory 12 and the display memory 13 is used for driving the main LCD 32 and the other is used for driving the sub LCD 33. As described above, the bit lines of the work memory 12 are one-to-one connected to those of the display memory 13; this architecture allows the bitmap data stored in the work memory 12 to be transferred to the data line driver 16 through the latch circuit 20, the bit lines of the displayed memory 13, and the latch circuit 14. In response to the transferred data, the data line driver 16 drives one of the main and sub LCDs 32 and 33 selected by the gate line drivers 24 and 25. It should be noted that transferring the bitmap data through the bit lines of the display memory 13 does not destroy the bitmap data stored in the display memory 13 when no word line is activated within the display memory 13.

As is the case of the aforementioned embodiment, the bitmap data stored in the display memory 13 is transferred to the data line driver 16 through the latch circuit 14.

The data line driver 16 drives one of the main and sub LCDs 32 and 33 selected by the gate line drivers 24 and 25 in response to the data received from the work memory 12 or the display memory 13.

The image stored within the work memory 12 (or the display memory 13) in the bitmap format may be displayed on the main and sub LCDs 32 and 33 at the same time. Displaying the same image on the main and sub LCDs 32 and 33 is achieved through activating the gate lines 32b and 33b within the main and sub LCDs 32 and 33 main at the same time while the data line driver 16 drives the data lines 32a within the main LCD 32 (and the data lines 33a within the sub LCD 33 through the data lines 32a).

Displaying the same image on the main and sub LCDs 32 and 33 is especially advantageous when the display device in this embodiment is used for a cell phone with an imaging device, including a CCD camera. In this case, the main LCD 32 is disposed on the main surface of the housing of the cell phone while the sub LCD 32 is disposed on the rear surface of the housing. This architecture allows an image captured by the image device to be displayed on the main and sub LCDs 32 and 33 at the same time, and thereby provide an entertaining function that a pair of cell phone users enjoy the captured image display on the LCDs 32 and 33 at the same time while facing each other.

In the second modification, in order to prepare a desired bitmap data onto the work memory 12, the memory controller 18 is designed to write the bitmap data 5 received from the CPU 2 into the work memory 18.

Figure 9:
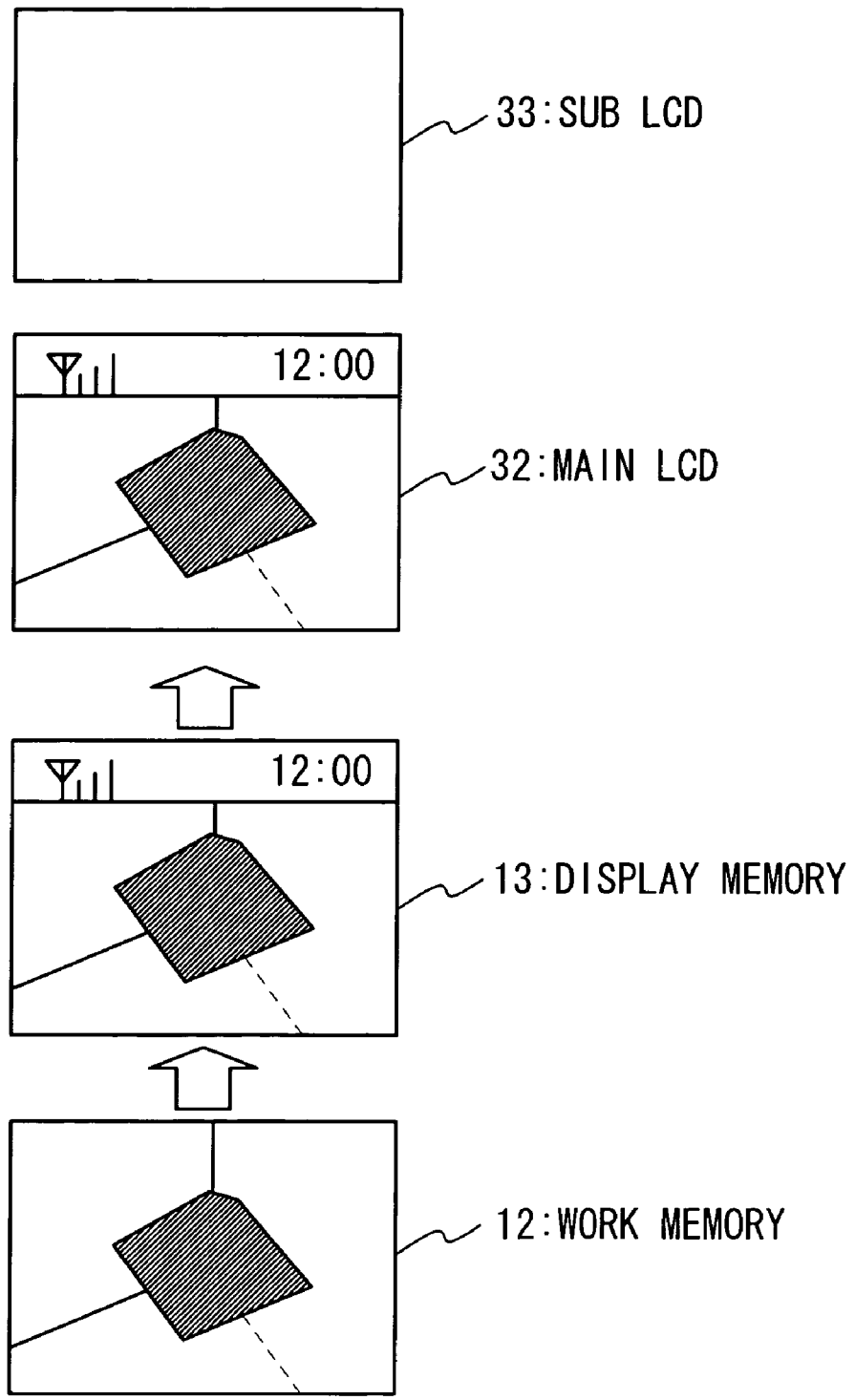
FIG. 9 is a diagram illustrating a preferred operation of the controller/driver in the second modification.

FIG. 9 illustrates the operation of the controller/driver 1 when the work memory 12 is used as the work area for converting the vector data 4 into the bitmap data. Firstly, the vector data 4 is inputted to the controller/driver 1 from the CPU 2. In response to the received vector data 4, the graphic engine 11 successively draws the graphic primitives onto the memory region of the work memory 12, and thereby develops the "complete" bitmap data on the work memory 12. The "complete" bitmap data is then transferred form the work memory 12 to the display memory 13. The main LCD 32 is driven by the data line driver 16 in response to the "complete" bitmap data stored in the display memory 13. Instead, the sub LCD 33 may be driven in response to the "complete" bitmap data. In this case, the data line driver 16 drives the data lines 33a within the sub LCD 33 through the data lines 32a within the main LCD 32.

Figure 10:
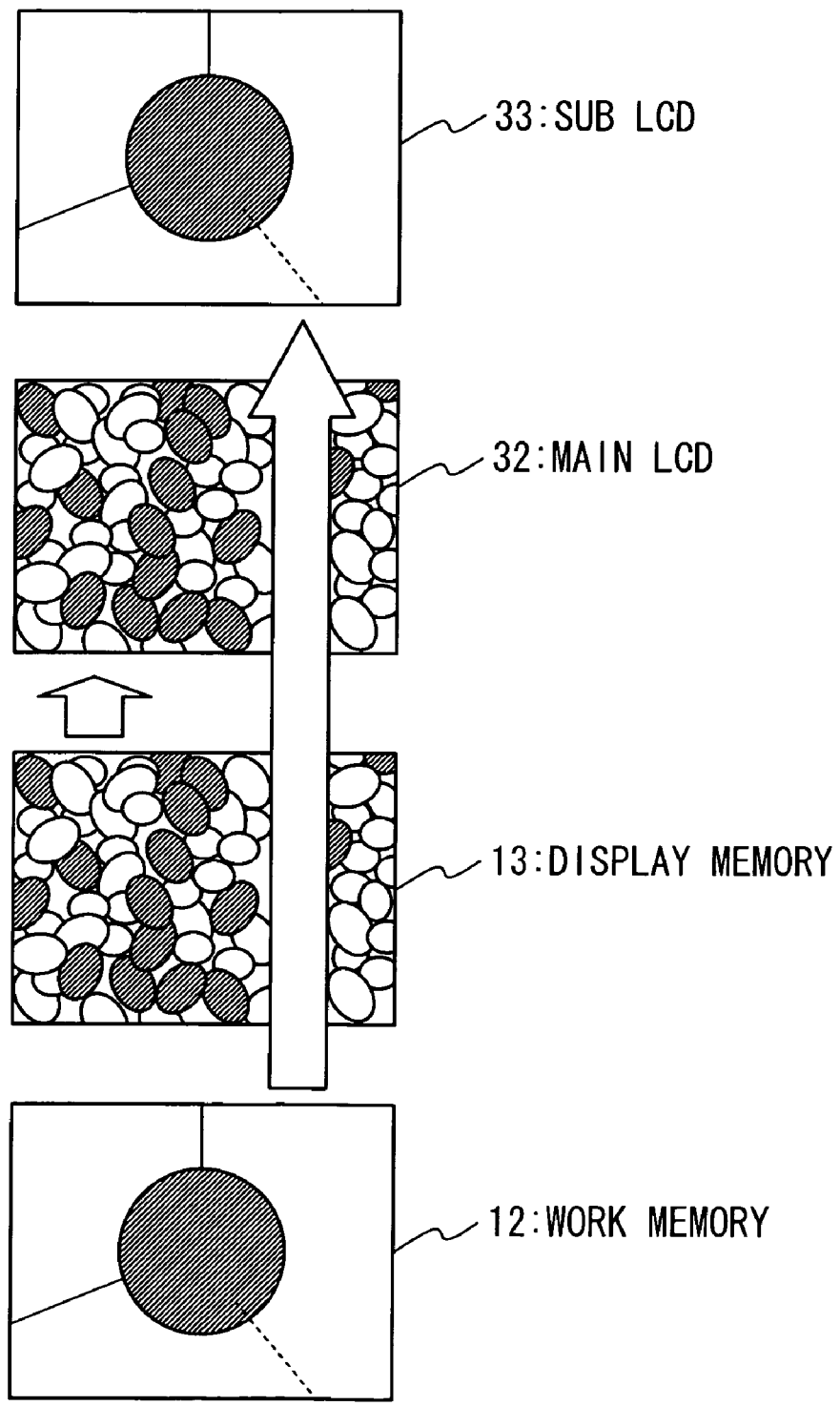
FIG. 10 is another diagram illustrating the preferred operation of the controller/driver in the second modification.

FIG. 10 illustrates the operation of the controller driver 1 when the sub LCD 33 is driven in response to the bitmap data stored in the work memory 12. Firstly, desired bitmap data is prepared for the work memory 12. The prepared bitmap data may be provided from the graphic engine 11 or from the CPU 2 through the memory controller 18. This is followed by sequentially transferring the bitmap data from the work memory 12 to the data line driver 16 through the bit lines of the display memory 13. The bitmap data stored in the display memory 13 are protected through deactivating all the word lines of the display memory 13. The data line driver 16 then drives the data lines 33a within the sub LCD 33 through the data lines 32a within the main LCD 32. In synchronization with the drive of the data lines 33a, the gate line driver 25 drives the gate lines 33a within the sub LCD 33. In order to protect the image displayed on the main LCD 32, all the gate lines 32b are deactivated. The thus-described procedure achieves the display of the bitmap data stored in the work memory 12 on the sub LCD 33. It should be noted that the main LCD 32 may be driven in place of the sub LCD 33 through activating the gate lines 32a of the main LCD 32 by the gate line driver 24 in place of the gate lines 33a of the sub LCD 33.

As thus described, the architecture in this modification allows the single controller/driver 1 to drive a pair of LCDs. This is an advantageous feature because driving a pair of LCDs conventionally requires a pair of controller/drivers and thus experiences an increase in the necessary circuit size. The controller/driver 1 in this modification, which can drive a pair of LCDs, is preferable for reducing the size of the circuits used for driving a pair of LCDs.

Third Modification

In third and fourth modifications, the controller/driver 1 is adapted to perform various calculations during the transfer of the bitmap data from the work memory 12 to the display memory 13. Providing calculating means for performing calculations on the transferred bitmap data preferably reduces a need for externally performing processing of the bitmap data, including processing by the CPU 2.

Figure 11:
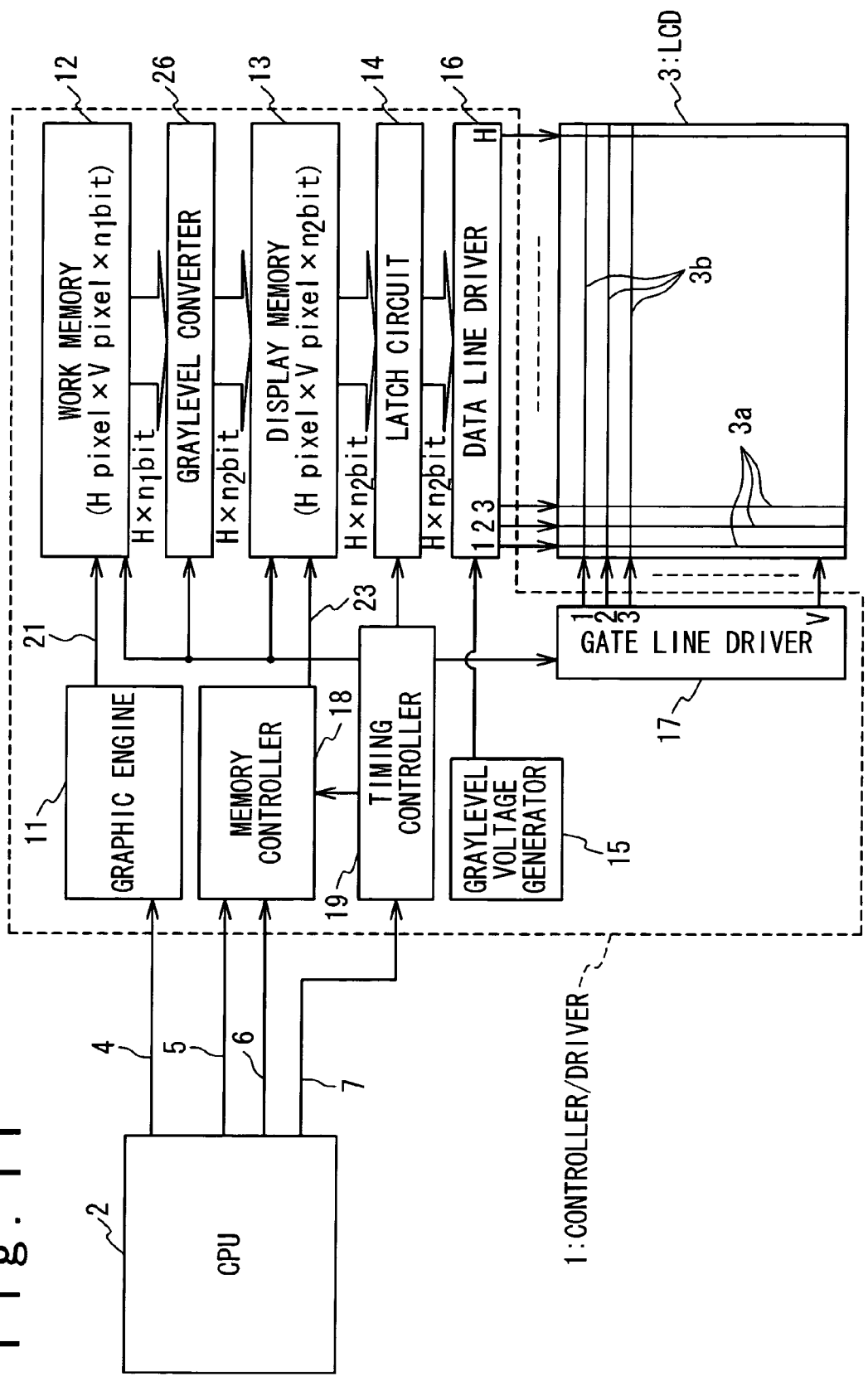
FIG. 11 is a block diagram of a display device in a third modification of the present invention.

As shown in FIG. 11, the controller/driver 1 in the third modification is comprised of a graylevel converter 26 interposed between the work memory 12 and the display memory 13. The gray level converter 26 allows the number of the data bits of the pixel data stored in the work memory 12 to be different from that stored in the display memory 13.

The number of the bit lines of the work memory 12 and the display memory 13 are modified in accordance with the numbers of the data bits of the pixel data. When the graylevel of each pixel is represented by $n_1$ bits within the bitmap data stored in the work memory 12, the number of the bit lines of the work memory 12 is $H \times n_1$. Correspondingly, the number of the bit lines of the display memory 13 is $H \times n_2$ when the graylevel of each pixel is represented by $n_2$ bits within the bitmap data stored in the display memory 13. The graylevel converter 26 converts the graylevel of each pixel data within the bitmap data stored in the work memory 12 into the graylevel representable by the bitmap data stored in the display memory 13.

Figure 12:
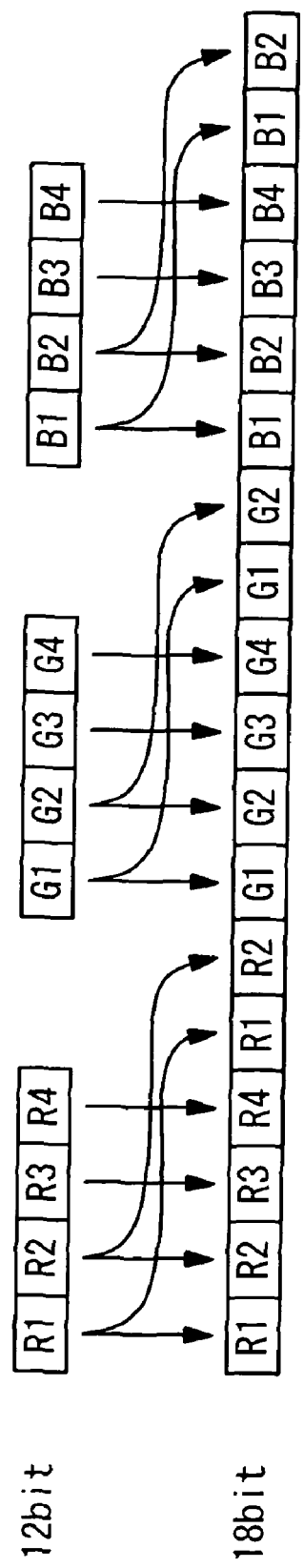
FIG. 12 is a diagram illustrating an exemplary operation of the controller/driver in the third modification.

FIG. 12 illustrates an exemplary operation of the graylevel converter 26. In this modification, four bits are used for representing the red, green and blue graylevels of each pixel within the work memory 12, while six bits are used for representing the red, green and blue graylevels of each pixel within the display memory 13. The graylevel converter 26 converts the graylevels of the bitmap data within the work memory 12 so that the upper four bits of six bits associated with red within each pixel data of the bitmap data stored in the display memory 13 is identical to the four bits of the associated pixel data of the bitmap data stored in the work memory 12. The same goes for data bits associated with green and blue. It should be noted that the operation of the graylevel converter 26 is not limited to that disclosed in this modification.

Fourth Modification

Figure 13:
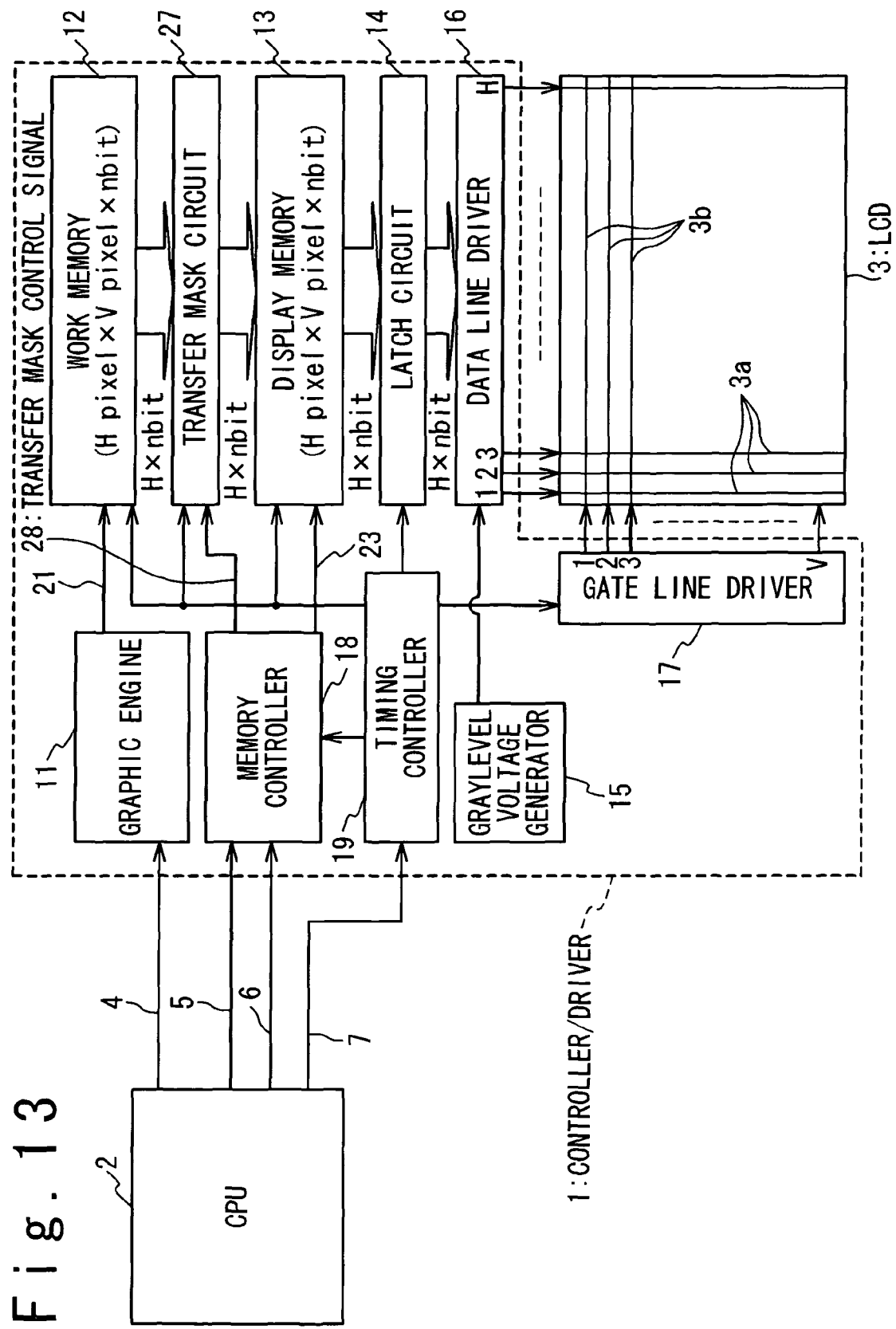
FIG. 13 is a block diagram illustrating a display device in a fourth modification of the present invention.

In a fourth modification, as shown in FIG. 13, a transfer mask circuit 27 is interposed between the work memory 12 and the display memory 13. The transfer mask circuit 27 masks a portion of the bitmap data outputted from the work memory 12, and provides the remaining portion of the bitmap data for the display memory 13. The transfer mask circuit 27 receives a transfer mask control signal 28 indicative of the portion to be masked from the memory controller 18, and performs the operation of the transferred bitmap data in response to the transfer mask control signal 28.

Figure 14:
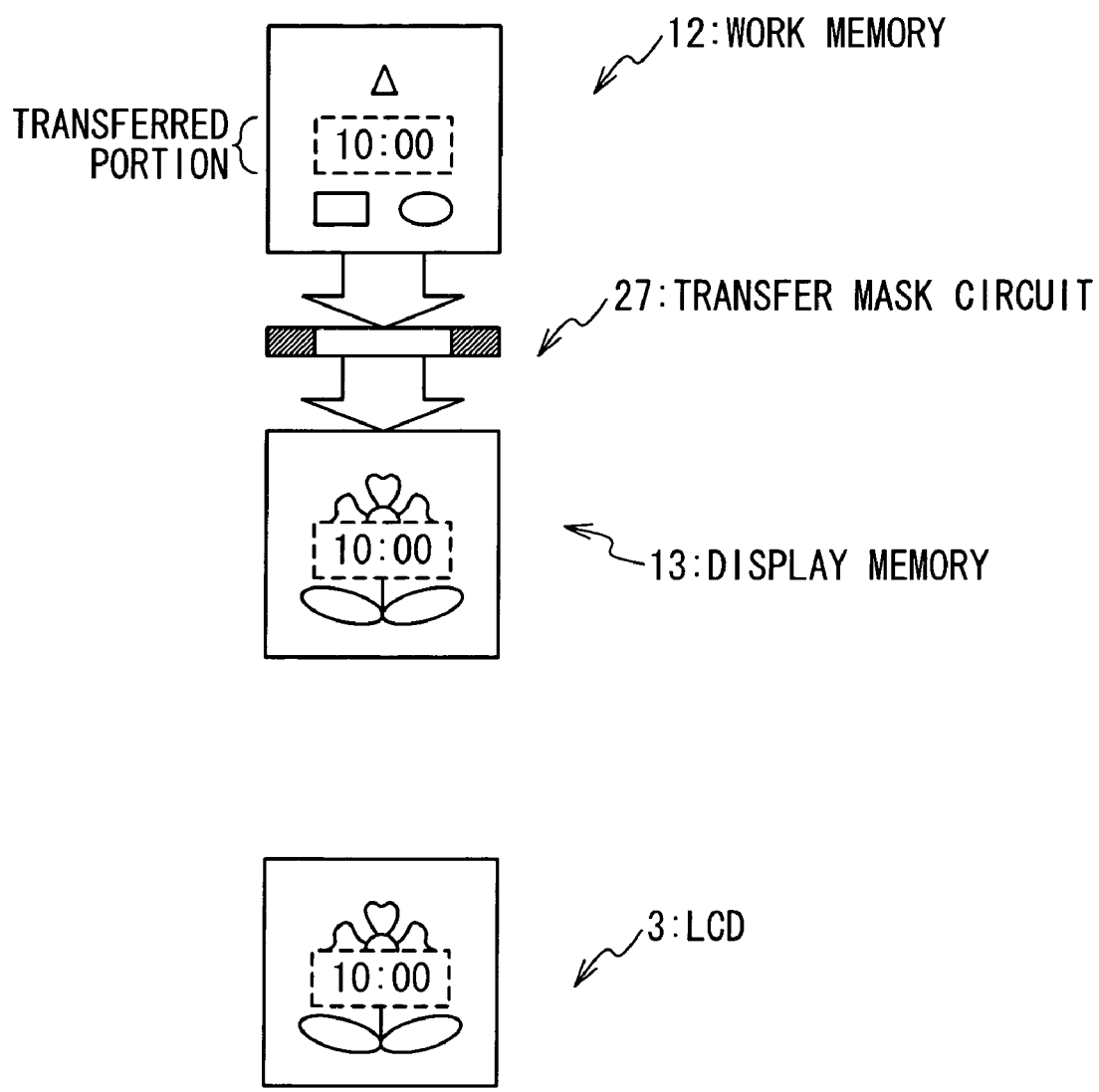
FIG. 14 is a diagram illustrating an exemplary operation of the controller/driver in the fourth modification.

FIG. 14 illustrates the operation of the controller/driver 1 in the fourth modification. Desired bitmap data are initially provided for the work memory 12 and the display memory 13, respectively. A desired portion of the bitmap data is transferred from the work memory 12 to the transfer mask circuit 27. The transfer mask circuit 27 masks a desired portion of the transferred bitmap data, and provides the remainder to the display memory 13. In FIG. 14, the unhatched area within the transfer mask circuit 27 represents the unmasked portion, that is, the portion transferred to the display memory 13, while the hatched areas represent the masked portion. The unmasked data is transferred and stored into the display memory 13.

This allows the desired portion of the image stored in the work memory 12 to be synthesized into the image stored in the display memory 13. The synthesized image is then displayed on the LCD 3.

Figure 15:
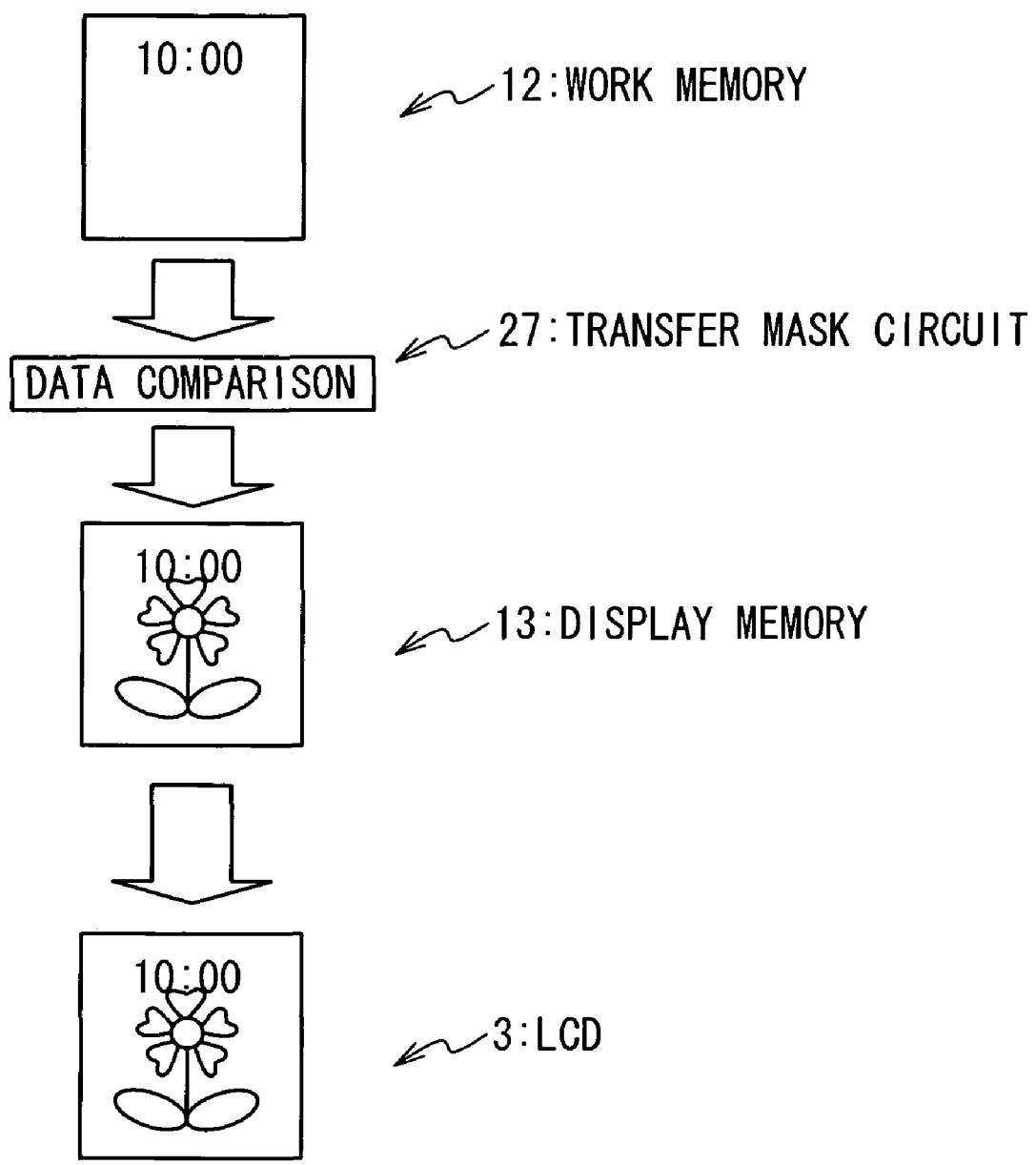
FIG. 15 is a diagram illustrating another exemplary operation of the controller/driver in the fourth modification.

The appropriate modification of the mask operation effectively achieves an OSD (on-screen display) for the image stored in the display memory 13. As shown in FIG. 15, for example, the work memory 12 may store an image including letters with a write background, while the transfer mask circuit 27 may be designed to mask the write portion of the image. In this case, transferring the image stored in the work memory 12 through the transfer mask circuit 27 results in that the portions of the image associated with the letters are updated within the display memory 13, and the letters are synthesized into the image stored in the display memory 13. The synthesized image including the letters is then displayed on the LCD 3.

In an alternative embodiment, animation is achieved through storing different images into a plurality of area within the work memory 12 and transferring these stored images to the same area circuit 27.

As shown in FIG. 16, for example, different images may be stored in scan areas 12a, 12b and 12c within the work memory 12, while the forward mask circuit 27 is adapted to mask the right portions of images transferred thereto. When receiving the image stored in the scan area 12 from the work memory 12, the transfer mask circuit 13 masks the right portion of the received image, and forwards the left portion to the display memory 13. The forwarded portion is stored in the area 13a within the display memory 13, and thereby synthesized to the image originally stored in the display memory 13. The image stored in the display memory 13 is then read out and displayed on the LCD 3.

This is followed by readout of the image stored in the scan area 12b from the work memory 12. The transfer mask circuit 27 receives the image stored in the scan area 12b, and masks the right portion of the received image while forwarding the left portion to the display memory 13. The forwarded portion is stored in the area 13a within the display memory 13, and thereby synthesized to the image originally stored in the display memory 13; the image data stored in the area 13a is modified within the display memory 13. The image stored in the display memory 13 is then read out and displayed on the LCD 3. This achieves partial modification of the image displayed on the LCD 3 with respect to the portion associated with the area 13a of the display memory 13.

The same goes for the scan area 12c. The transfer mask circuit 27 receives the image stored in the scan area 12c, and masks the right portion of the received image while forwarding the left portion to the display memory 13. The forwarded portion is stored in the area 13a within the display memory 13, and thereby synthesized to the image originally stored in the display memory 13; the image data stored in the area 13a is modified within the display memory 13. The image stored in the display memory 13 is then read out and displayed on the LCD 3. This achieves partial modification of the image displayed on the LCD 3 with respect to the portion associated with the area 13a of the display memory 13.

As thus described, the controller/driver 1 in this modification achieves animation through storing different images into a plurality of area within the work memory 12 and transferring the stored images to the same area of the display memory 13 through the forward mask circuit 27; the controller/driver 1 in this modification achieves animation through providing the only modified portion of the image to be displayed on the LCD 3, not the whole of the image, for the work memory 12. This architecture is useful for reducing the amount of the image data to be transmitted to the controller/driver 1.

Fifth Modification

The work memory 12, which is used as the work area for converting the vector data 4 into the corresponding bitmap data, is preferably used for other purposes to thereby provide the controller/driver 1 with various functions. In fifth through ninth modifications, the controller/driver 1 is adapted to use the work memory 12 for not only the work area but also other purposes.

Figure 17:
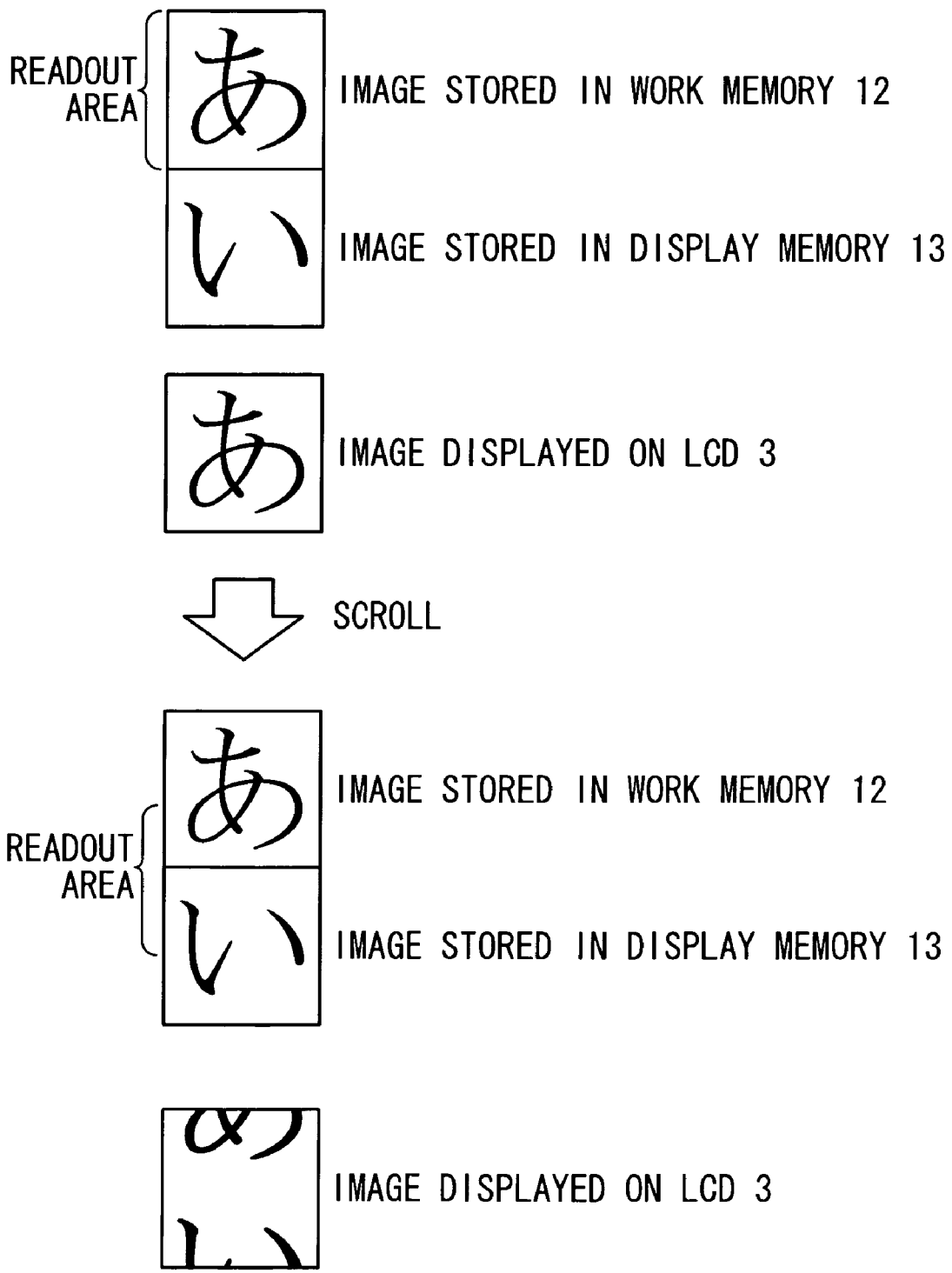
FIG. 17 is a diagram illustrating an exemplary operation of controller/driver in a fifth modification of the present invention.

In a fifth modification, the controller/driver 1 achieves image scroll using the work memory 12 and the display memory 13. FIG. 17 illustrates the procedure for achieving image scroll. Bitmap data representing different images are initially prepared on the work memory 12 and the display memory 13. The bitmap data stored in the work memory 12 may be generated by the graphic engine 11 or provided from the CPU 2 through the memory controller 18.

Different portions of the bitmap data stored in the work memory 12 and the display memory 13 are successively selected to be read out, and the LCD 3 is driven in response to the selected bitmap data portion. At the first frame, for example, the whole of the bitmap data stored in the work memory 12 is read out from the work memory 12 and used to drive the LCD 3. At the next frame, the bitmap data portion associated with the second through V-th lines is read out from the work memory 12, while the bitmap data portion associated with the first line is readout from the display memory 13. These bitmap data portions are used to drive the LCD 3. The bitmap data portions stored in the work memory 12 are transferred to the data line driver 16 through the bit lines of the display memory 13. As described in the third modification, it should be noted that the bitmap data stored in the display memory 13 is not destroyed if no word line is activated within the display memory 13. Correspondingly, further different portions of the bitmap data are successively read out from the work memory 12 and the display memory 13 to drive the LCD 3. This procedure effectively achieves image scroll on the LCD 3.

Sixth Modification

In a sixth modification, the controller/driver 1 is adapted to achieve pseudo grayscale representation using a frame rate control technique.

FIG. 18 is a diagram illustrating the method for achieving pseudo grayscale representation in this modification. Images having different graylevels are initially stored in the bitmap data format in the work memory 12 and the display memory 13. The images stored in the work memory 12 and the display memory 13 are alternately displayed to thereby achieve the pseudo grayscale representation. As described in the third modification, it should be noted that the bitmap data stored in the display memory 13 is not destroyed if no word line is activated within the display memory 13.

Seventh Modification

In a seventh modification, the controller/driver 1 is adapted to perform coordinate and/or size conversion of the desired image using the work memory 12 and the display memory 13, the coordinate conversion including parallel displacement, rotation, inversion, and combinations thereof.

Figure 19:
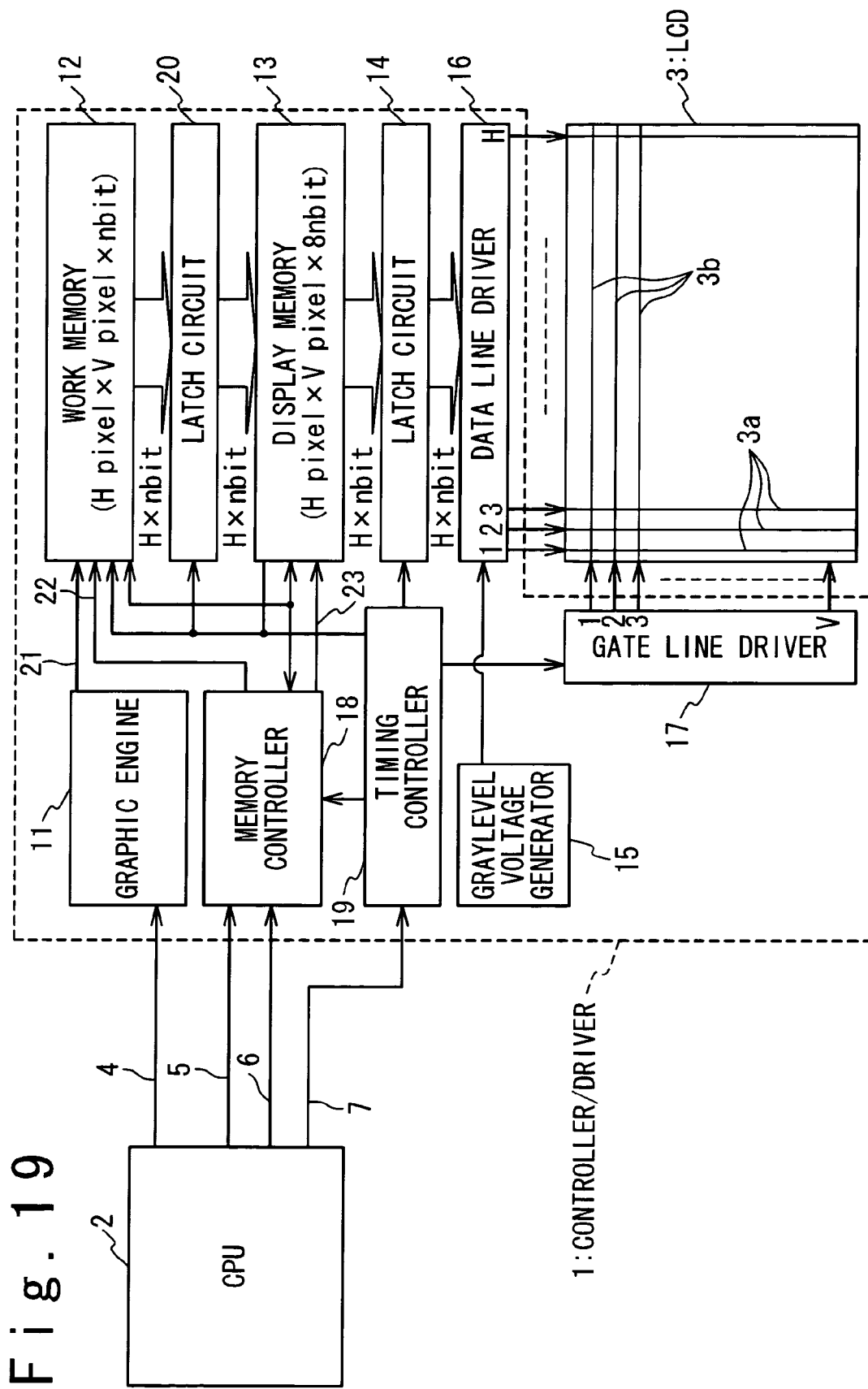
FIG. 19 is a block diagram illustrating a display device in a seventh modification of the present invention.

In this modification, as shown in FIG. 19, the memory controller 18 is designed to access to both of the work memory 12 and the display memory 13. Additionally, the memory controller 18 is designed to perform the coordinate and/or size conversion.

Figure 20:
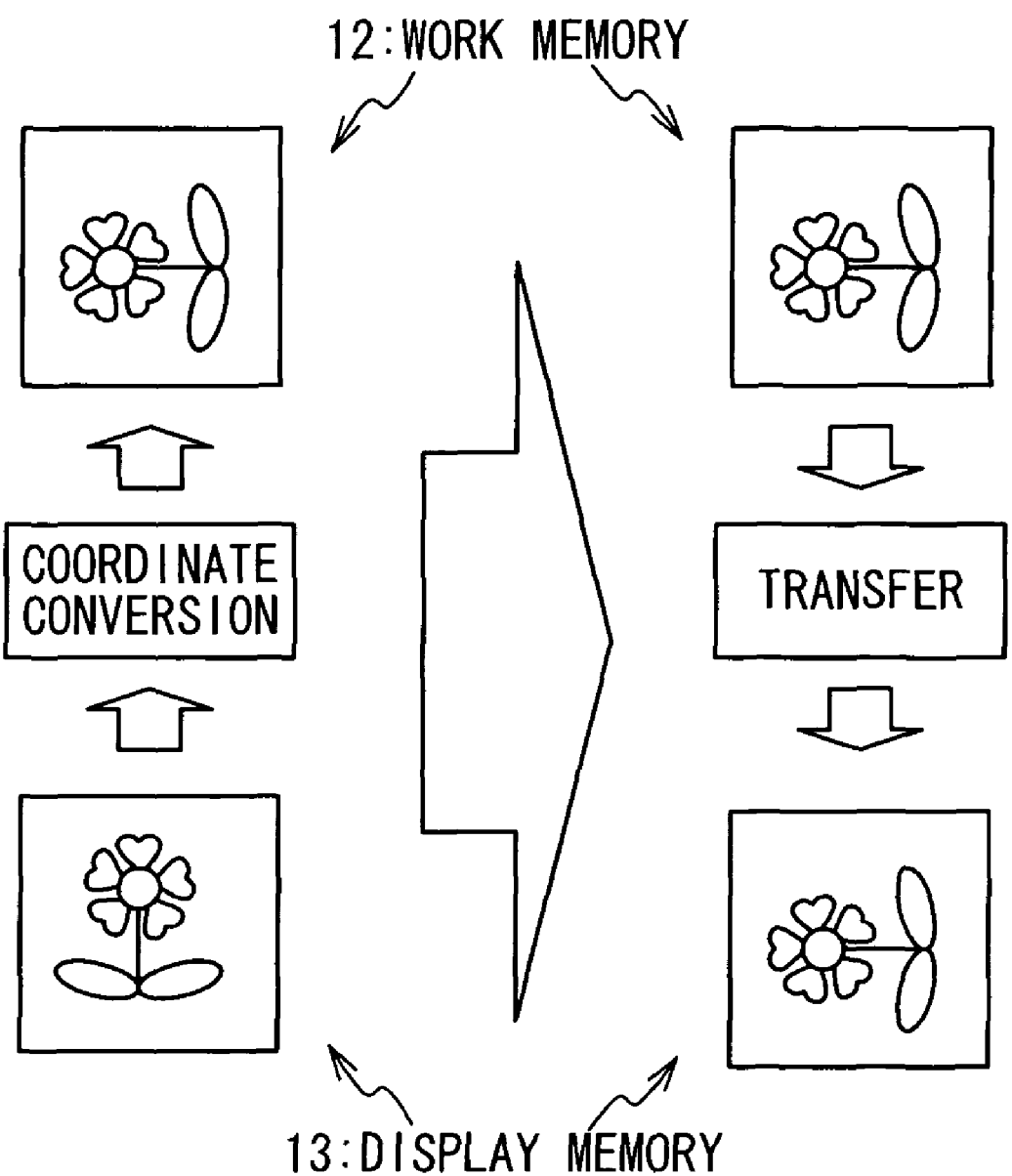
FIG. 20 is a diagram illustrating an operation of the controller/driver in the seventh modification.

FIG. 20 is a diagram illustrating the procedure of coordinate conversion. The memory controller 18 obtains the bitmap data stored in the display memory 13, and performs desired coordinate conversion on the obtained bitmap data. The memory controller 18 then stores the converted bitmap data into the work memory 12. The bitmap data stored in the work memory 12 is then transferred to the display memory 13 to drive the LCD 3 in response to the converted bitmap data. The LCD 3 is then driven in response to the converted bitmap data stored in the display memory 13. This results in that the coordinate-converted image is displayed on the LCD 3. In place of, or in addition to the coordinate conversion, size conversion may be performed to display the size-converted bitmap data.

Instead, the bitmap data stored in the work memory 12 may be transferred to the display memory 13 after coordinate and/or size conversion. In this case, the memory controller 18 performs desired coordinate and/or size conversion on the bitmap data received from the work memory 12, and stores the converted bitmap data into the display memory 13. The LCD 3 is then driven in response to the bitmap data stored in the display memory 13. This results in that the image after coordinate and/or size conversion is displayed on the LCD 3.

Eighth Modification

In an eighth modification, the controller/drive 1 is designed to perform image dithering using the work memory 12 and the display memory 13. In order to perform image dithering, in this modification, the memory controller 18 is designed to access to both of the work memory 12 and the display memory 13, and to perform calculation for the image dithering.

Figure 21:
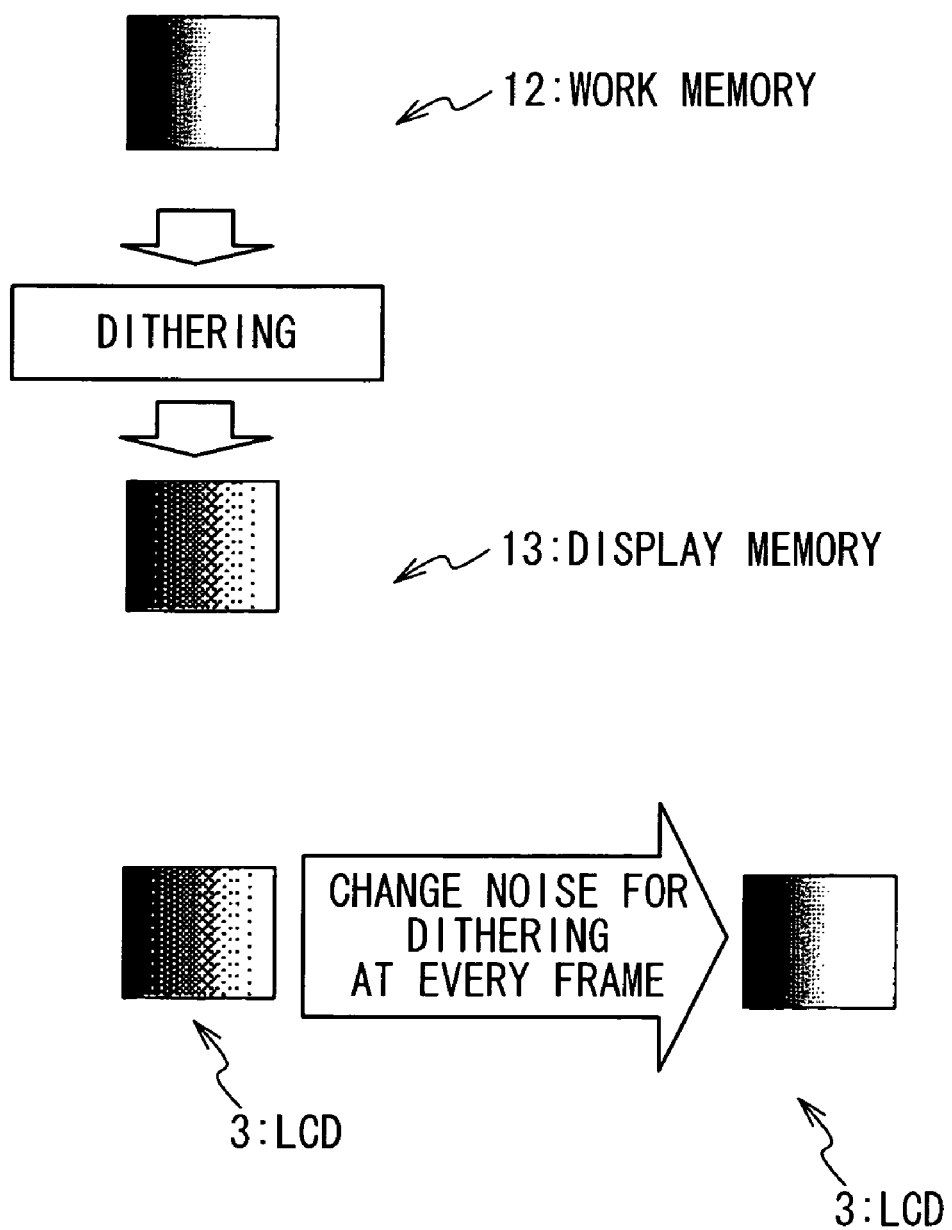
FIG. 21 is a diagram illustrating an operation of the controller/driver in the eighth modification.

FIG. 21 is a diagram illustrating the procedure for performing the image dithering. The memory controller 18 receives the bitmap data from the work memory 12, and performs dithering on the image of the received bitmap data. The memory controller 18 then stores the dithered image in the bitmap data format in the display memory 13. The LCD 3 is driven in response to the bitmap data stored in the display memory 13. This results in that the dithered image is displayed on the LCD 3. In a preferred embodiment, the noises used for dithering are changed at every frame to achieve a frame rate control (FRC); this effectively improves the number of available graylevels of the image on the LCD 3.

Ninth Modification

Figure 22A:
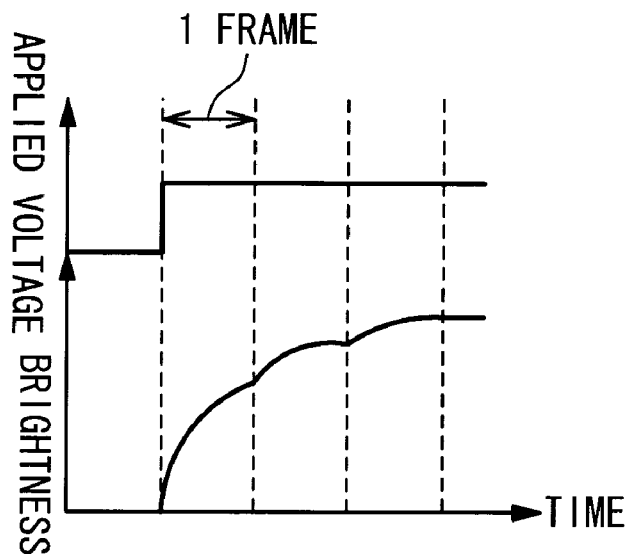
FIG. 22A is a timing chart illustrating a procedure of a normal drive method.
Figure 22B:
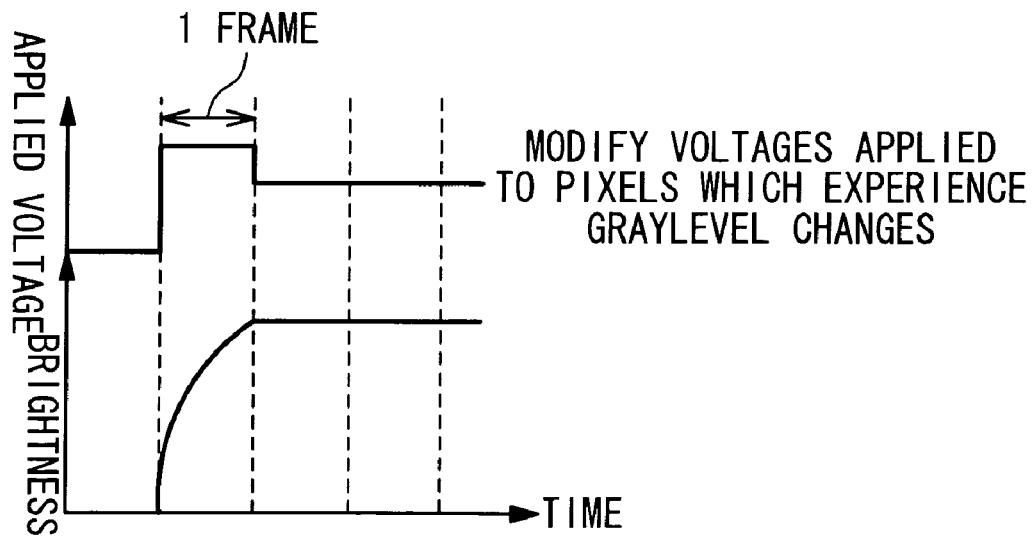
FIG. 22B is a timing chart illustrating a procedure of an overdrive method.

In a ninth modification, the work memory 12 is used as a work area for achieving an LCD overdrive technique, which designates a method for improving the response speed of LCDs by modifying drive voltages applied to pixels that experience graylevel change. FIG. 22A illustrates a timing chart for a normal drive method, while FIG. 22B illustrates timing charts for a typical overdrive method. As illustrated in FIG. 22B, a typical overdrive method involves driving pixels that experience increases in the graylevels at a certain frame with increased voltages larger than voltages originally corresponding with the graylevels. This effectively reduces response times of the pixels.

In conventional LCD systems, a controller/driver receives a pair of image data from a CPU, one being image data corresponding to a normal image, and the other being image data generated for achieving the overdrive. Such architecture undesirably increases the amount of image data transferred from the CPU to the controller/driver. In contrary, the controller/driver 1 in the ninth embodiment is adapted to perform calculations by itself for achieving overdrive, and thereby effectively reduces the amount of image data transferred from the CPU 2 to the controller/driver 1.

LCD overdrive techniques involve comparing images of previous and current frames to determine pixels that experience graylevel changes, and calculating modified graylevels for the graylevel-changed pixels. The work memory 12 is used for the work area for performing the calculation of the modified graylevels.

Figure 23A:
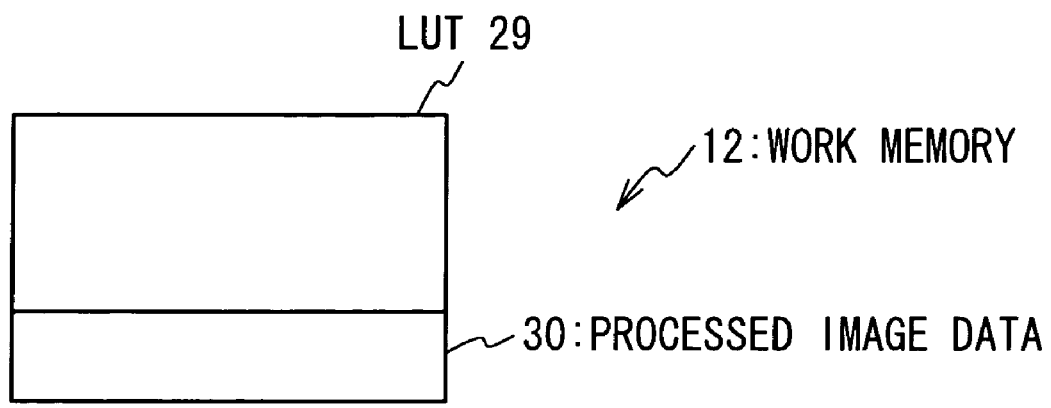
FIG. 23A is a diagram illustrating data stored in the work memory in the ninth embodiment.
Figure 23B:
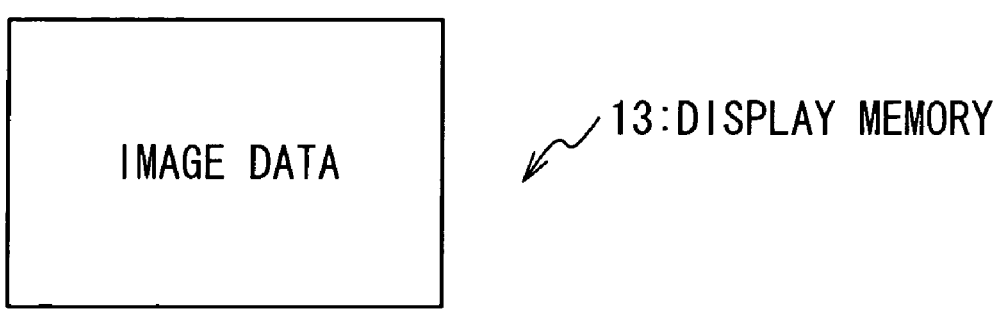
FIG. 23B is a diagram illustrating data stored in the display memory in the ninth embodiment.

Specifically, in this modification, the memory controller 18 is adapted to access to both of the work memory 12 and the display memory 13, and to perform calculations required for LCD overdrive. Additionally, as shown in FIG. 23, a look-up table (LUT) 29 is provided for the work memory 12, while bitmap data of desired image is provided for the display memory 13. The LUT 29 describes an association of original graylevels and changes in graylevels with modified graylevels.

The bitmap data is successively obtained from the display memory 13 in unit of lines, and the LCD 3 is driven in response to the readout bitmap data. When the obtained line includes one or more pixels that experience graylevel change, the memory controller 18 performs calculation for modifying the graylevels of graylevel-changed pixels with reference to the LUT 29. Additionally, the memory controller 18 stores graylevel-modified image data 30 obtained through this calculation into the work memory 12.

For the lines which include no pixel experiencing graylevel change, the bitmap data associated therewith is read out from the display memory 13, and directly used for driving the LCD 3. In contrary, the graylevel-modified image data 30 stored in the work memory 12 is used for driving the LCD 3 for the lines which include one or more pixels experiencing graylevel change.

The architecture thus described allows the controller/driver 1 to internally perform calculation for LCD overdrive.

Tenth Modification

Figure 24:
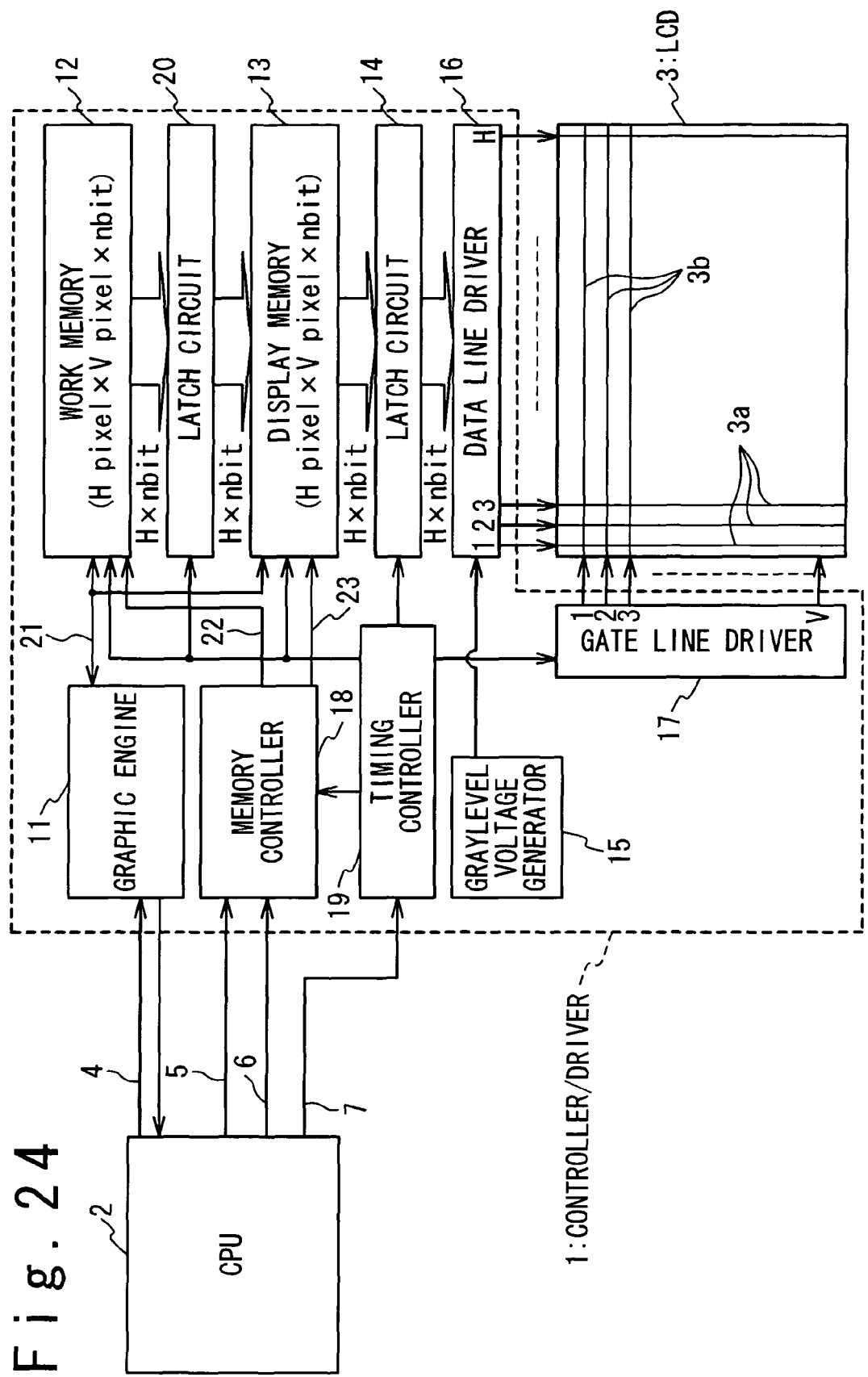
FIG. 24 is a block diagram illustrating a display device in a tenth modification of the present invention.

In a tenth modification, the controller/driver 1 is adapted to perform fast operations of a pair of images using the work memory 12 and the display memory 13. As shown in FIG. 24, the graphic engine 11 is adapted to access to both of the work memory 12 and the display memory 13 in the tenth modification. Additionally, the graphic engine 11 is adapted to perform operations on a pair of images, one being stored in the work memory 12, and the other being stored in the display memory 13. The operations performed by the graphic engine 11 include alpha blending and calculation of image difference. The graphic engine 11 is adapted to perform alpha blending on the image pair stored in the work memory 12 and the display memory 13, and to output the alpha-blended image to the CPU 2. Additionally, the graphic engine 11 is adapted to calculate difference of the images stored in the work memory 12 and the display memory 13, and to output the calculated image difference to the CPU 2. The image difference may be used for converting the image stored in the work memory 12 or the display memory 13 into the MPEG format.

Eleventh Modification

FIG. 25 is a block diagram illustrating the controller/driver 1 in the eleventh embodiment. In this embodiment, the vector data 4 and the bitmap data 5 are transmitted to a common data bus 35 from the CPU 2 to the controller/driver 1; the image data transferred over the data bus 35 is referred by numeral 34 in FIG. 25. The controller/driver 1 in this modification includes a signal controller 36 responsive to a data switching signal received from the CPU 2 for forwarding the image data 34 to a desired destination; the data switching signal is indicative of whether the image data 34 is the vector data 4 or the bitmap data 5. The data switching signal may be received through a signal line separately provided from the data bus 35, or a signal line within the data bus 35. Correspondingly, the memory control signal 6 and other control signals may be transferred through the data bus 35. It is apparent to those skilled in the art that the architecture disclosed in the eleventh modification is applicable to the other controller/driver architectures disclosed in this embodiment.

Although the invention has been described in its preferred form with a certain degree of particularity, it is understood that the present disclosure of the preferred form has been changed in the details of construction and the combination and arrangement of parts may be resorted to without departing from the scope of the invention as hereinafter claimed.

Especially, it should be understood that the present invention may be applied to other display devices, such as OLED (Organic light emitting diode) displays.

The invention claimed is:

1. A controller/driver comprising:
   a work memory;
   a graphic engine converting externally received image data into first bitmap data, and storing said first bitmap data into said work memory;
   a display memory receiving and storing second bitmap data developed from said first bitmap data stored in said work memory; and
   a driver circuit which receives said second bitmap data from said display memory, and drives a display panel in response to said second bitmap data received from said display memory,
   wherein said first bitmap data includes a plurality of line data each including a plurality of pixel data associated with respective pixels associated with a corresponding gate line of said display panel, and
   wherein said data transfer of said first bitmap data from said work memory to said display memory is performed such that each of said plurality of line data is transferred at the same time in parallel from said work memory to said display memory.

2. The controller/driver according to claim 1, wherein said image data is described in a vector format.

3. The controller/driver according to claim 1, wherein said image data includes compressed image data.

4. The controller/driver according to claim 1, further comprising:
   a latch receiving said line data from said work memory, and temporally storing said received line data.

5. The controller/driver according to claim 1, further comprising:
   a timing controller controlling said work memory, said display memory, and said driver circuit so that said data transfer of said first bitmap data from said work memory to said display memory is synchronous with readout of said second bitmap data from said display memory to said driver circuit; and
   a memory controller connected to said second input port of said work memory, said memory controller receiving bit map data from a processor for storage in said display memory.

6. The controller/driver according to claim 5, wherein said data transfer of said first bitmap data from said work memory to said display memory is initiated in response to activation of a frame synchronization signal indicating to start displaying each image frame.

7. The controller/driver according to claim 5, wherein said timing controller controls said display memory, and said driver circuit so that said data transfer of said first bitmap data from said work memory to said display memory does not overrun said readout of said second bitmap data from said display memory to said driver circuit.

8. The controller/driver according to claim 1, wherein said work memory includes:
   a plurality of first bit lines,
   a plurality of first word lines, and
   a plurality of first memory cells disposed at respective intersections of said first bit lines and first word lines to store therein said first bitmap data,
   wherein said display memory includes:
   a plurality of second bit lines,
   a plurality of second word lines, and
   a plurality of second memory cells disposed at respective intersections of said second bit lines and second word lines to store therein said second bitmap data,
   wherein a number of said first bit lines is same as that of said second bit lines, and
   wherein said first bit lines are connected to said second bit lines, respectively.

9. The controller/driver according to claim 8, wherein a number of said first word lines is identical to that of said second word lines.

10. The controller/driver according to claim 8, further comprising a timing controller controlling said work memory, and said display memory, and said driver circuit,
    wherein said driver circuit is connected to said second bit lines, and
    wherein said timing controller is adapted to deactivate said display memory to allow said first bitmap data to be transmitted from said work memory to said driver circuit through said second bit lines.

11. The controller/driver according to claim 10, wherein said timing controller is adapted to successively change portions of said first and second bitmap data stored in said work memory and said display memory to be transferred to said driver circuit.

12. The controller/driver according to claim 1, further comprising a processing circuit which processes said bitmap data received from said work memory to develop said bitmap data to be displayed and stores said developed bitmap data in said display memory.

13. The controller/driver according to claim 1, further comprising another processing circuit which processes said bitmap data stored in said display memory, and provides said processed bitmap data for said work memory.

14. The controller/driver according to claim 1, further comprising:
    a latch receiving said first bitmap data from said work memory, and temporally storing said first bitmap data; and
    a timing controller for controlling output of data from said latch,
    wherein said display memory receives said first bitmap data output from said latch,
    wherein said work memory and said display memory are operated at different times due to having said latch provided therebetween.

15. The controller/driver according to claim 1, further comprising:
    means for transferring said first bitmap data from said work memory to said display memory; and
    means for displaying said second bitmap data output from said display memory on said display panel,
    wherein a first rate at which said first bitmap data is transferred from said work memory to said display memory is faster than a second rate at which said second bitmap data is output from said display memory for display on said display panel.

16. The controller/driver according to claim 1, further comprising:
a graylevel converter interposed between the work memory and the display memory, the graylevel converter allowing a number of data bits corresponding to said first bitmap data stored in the work memory to be different from a number of data bits corresponding to said second bitmap data stored in the display memory.

17. The controller/driver according to claim 16, wherein the graylevel converter converts graylevels of the first bitmap data stored in the work memory so that an upper M bits of N bits associated with a particular color within each pixel data of the first bitmap data stored in the display memory is identical to the M bits of the associated pixel data of the first bitmap data stored in the work memory, wherein M and N are integers, with M less than N.

18. A display device comprising:
a controller/driver; and
a first display panel including:
a plurality of first data lines, and
a plurality of first gate lines,
a second display panel including:
a plurality of second data lines respectively connected to said first data lines, and
a plurality of second gate lines,
wherein said controller driver includes:
a work memory comprising a plurality of first bit lines,
a graphic engine converting externally received image data into first bitmap data to store into said work memory,
a display memory storing a second bitmap data and comprising a plurality of second bit lines respectively connected to said first bit lines,
a data line driver driving said first data lines,
a first gate line driver driving said first gate lines,
a second gate line driver driving said second gate lines, and
a controller circuit controlling said work memory, said display memory, said data line driver, and said first and second gate line drivers,
wherein said controller circuit is adapted to deactivate said display memory to thereby allow said first bitmap data to be transmitted to said data line driver through said second bit lines, and to allow said second bitmap data to be transmitted from said display memory to said data line driver, and
wherein said controller circuit is adapted to control said first and second gate line drivers to allow said data line driver to drive said second data lines of said second display panel through said first data lines of said first display panel.

19. The display device according to claim 18, wherein said controller circuit is adapted said first and second gate line drivers to allow the same image to be displayed on said first and second display panels in response to one of said first and second bitmap data.

* * * * *